United States Patent [19]

Mitsuishi et al.

[11] Patent Number: 4,931,997
[45] Date of Patent: Jun. 5, 1990

[54] SEMICONDUCTOR MEMORY HAVING STORAGE BUFFER TO SAVE CONTROL DATA DURING BULK ERASE

[75] Inventors: Naoki Mitsuishi; Kiyoshi Matsubara, both of Kodaira; Yoh Takamori, Kokubunji; Yoshiyuki Ozawa, Fuchu, all of Japan

[73] Assignee: Hitachi Ltd., Tokyo, Japan

[21] Appl. No.: 159,193

[22] Filed: Feb. 23, 1988

[30] Foreign Application Priority Data

Mar. 16, 1987 [JP]  Japan ................................ 62-58808
Jun. 3, 1987 [JP]  Japan ................................ 62-139402

[51] Int. Cl.$^5$ ............................................ G11C 11/00
[52] U.S. Cl. ..................................... 365/218; 365/195; 365/228; 364/246.6; 364/246.91; 364/969
[58] Field of Search ... 364/200 MS File, 900 MS File; 242/198; 365/189.01, 195, 228, 218

[56]  References Cited

U.S. PATENT DOCUMENTS

| | | | |
|---|---|---|---|
| 4,130,890 | 12/1978 | Adam | 365/189.01 |
| 4,428,047 | 1/1984 | Hayn et al. | 364/200 |
| 4,506,322 | 3/1985 | Leigh | 364/200 |
| 4,521,852 | 6/1985 | Guttag | 364/200 |
| 4,686,620 | 8/1987 | Ng | 364/200 |
| 4,752,871 | 6/1988 | Sparks et al. | 364/200 |
| 4,802,117 | 1/1989 | Chrosny et al. | 364/900 |
| 4,821,240 | 4/1989 | Nakamura et al. | 365/195 |

FOREIGN PATENT DOCUMENTS 59-98395  6/1984  Japan .

OTHER PUBLICATIONS

"Hitachi Hyoron (Hitachi Review)", vol. 68, No. 7, pp. 75-78, issued on Jul. 25, 1986 by Hitachi Kyoron Sha.

*Primary Examiner*—James W. Moffitt
*Assistant Examiner*—Gopal C. Ray
*Attorney, Agent, or Firm*—Fay, Sharpe, Beall, Fagan, Minnich & McKee

[57]  ABSTRACT

A volatile storage circuit for latching data is disposed outside a non-volatile memory array. Before a bulk erase of the memory array, some of the data items contained therein are transferred to and held by the storage circuit. The data items thus saved are rewritten to the non-volatile memory array after the bulk erase, or alternatively, on the basis of control data items transferred to the storage circuit, only regions designated by these data items are subjected to the bulk erase. Thus, in case of a bulk erase of an EEPROM, some of the stored data items can be preserved, so as to prevent illicit use of and maintain the integrity of the preserved data. Also the testing time of the data rewritten to the memory array is reduced because of the elimination of the need to test the memory area containing the preserved data in that only the integrity of the memory area containing data sourced externally need be tested.

18 Claims, 14 Drawing Sheets

FIG. 3
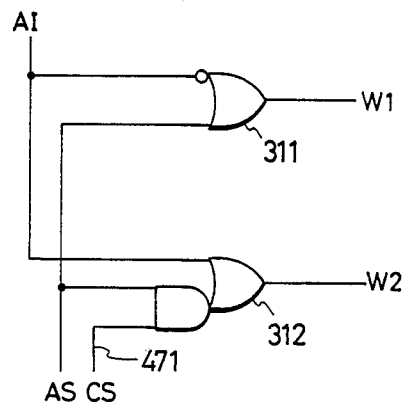
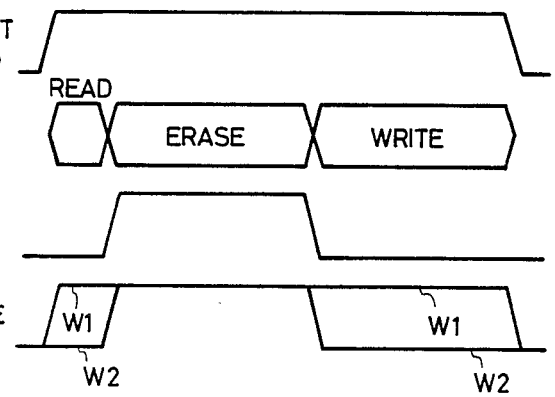
FIG. 4A   ALL SELECT SIGNAL AS
FIG. 4B   INTERNAL OPERATION MODE
FIG. 4C   ADDRESS DECODER CONTROL LINE CS
FIG. 4D   WORD LINE FIG. 7
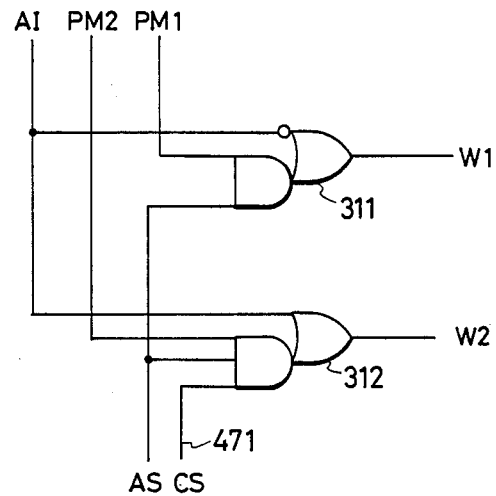
FIG. 8A  ALL SELECT SIGNAL AS 
FIG. 8B  INTERNAL OPERATION MODE 
FIG. 8C  ADDRESS DECODER CONTROL LINE CS 
FIG. 8D  PM1, PM2 
FIG. 8E  W1 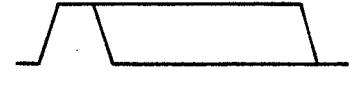
FIG. 8F  W2 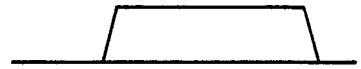

FIG. 9
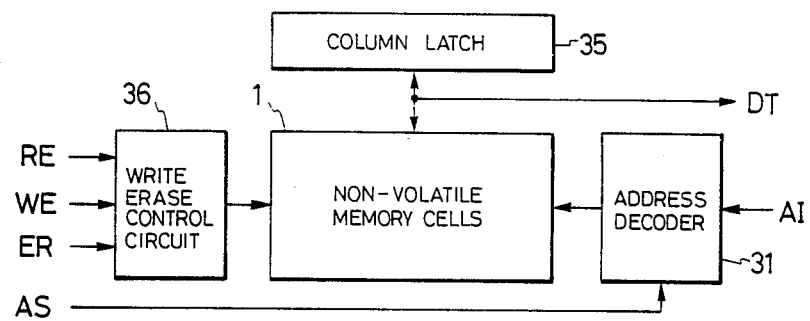
FIG. 10A  INTERNAL OPERATION MODES
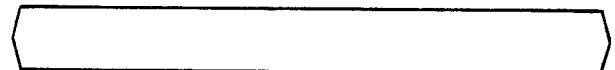
FIG. 10B  ROW ADDRESS SIGNALS
FIG. 10C  COLUMN ADDRESS SIGNALS
FIG. 10D  DATA
FIG. 10E  WE

SEMICONDUCTOR MEMORY HAVING STORAGE BUFFER TO SAVE CONTROL DATA DURING BULK ERASE

BACKGROUND OF THE INVENTION

The present invention relates to semiconductor storage technology, and more particularly to non-volatile memories which are electrically writable and erasable. Specifically, it relates to techniques which are effective when utilized for a non-volatile memory and a microcomputer including the non-volatile memory.

An EEPROM (Electrically Erasable and Programmable Read Only Memory) is a non-volatile memory, and it is electrically rewritable. To the contrary, however, this feature has been a problem because data to be conserved might be rewritten. For the protection of the data of a non-volatile memory, accordingly, there has been proposed a method wherein a bit for security is provided and wherein access from outside the memory is inhibited depending upon the status of this bit. Such a data protection system based on the security bit is stated in, for example, "Electronic Design," Mar. 3, 1983, pp. 123-128.

More specifically, a write-only security register including a non-volatile memory cell which is isolated from ordinary memory cells intended for rewriting data is disposed, and access to the memory cells is inhibited depending upon the status of the specified bit of the register. In this case, the security register is so constructed that it can erase data only at the time of the overall and simultaneous erase operations of the memory cells. Thus, after protection information indicating the protection of the data in the memory cells has been written into the security register, the memory cells cannot be accessed without destroying the data thereof, and the data can be kept secret.

With this method, however, the information in the security register is lost by the overall and simultaneous erasure of the memory cells, to establish the same status as an initial status. It has therefore been impossible to eliminate the apprehension that the memory will be illegally used after the overall and simultaneous erasure. The reason is that, after the initialization of the memory by the overall and simultaneous erasure, the memory can be reused by writing any false data. This has posed a problem in a case where important information such as money information is stored in an application to, for example, a cash card. Meanwhile, since the EEPROM requires long write/ erase times, increase in the storage capacity thereof has made the overall erase function of the memory cells indispensable to shortening a test time. It has accordingly been a subject that the overall and simultaneous erasure is compatible with the inhibition of the unlawful initialization.

There has also been proposed an EEPROM wherein a column latch circuit is disposed every data line of memory cells, thereby making it possible to write data items collectively every row address (refer to "Hitachi Hyōron- (Hitachi Review), Vol. 68, No. 7," pp. 75-78 issued on July 25, 1986 by Hitachi Hyōron- Sha). The column latch makes it possible to simultaneously write or rewrite a plurality of data items, and has been utilized only for efficaciously shortening write/rewrite times per unit data.

SUMMARY OF THE INVENTION

An object of the present invention is to provide a non-volatile memory in which the overall and simultaneous erasure of memory cells is made possible, while if necessary, some of stored data items are permitted to be conserved even after the simultaneous erasure, thereby making it possible to inhibit the unlawful initialization of the memory, and to provide a technique which makes a high degree of secrecy protection possible owing to such conservation of some data items.

Another object of this invention is to provide a semiconductor memory which makes it possible by means of a comparatively simple circuit arrangement to protect the stored data of one part of a non-volatile memory and to simultaneously write or rewrite data into or at the other part.

Another object of this invention is to realize the effective prevention of the bad use of an IC card which employs a single-chip microcomputer having a built-in non-volatile memory.

The aforementioned and other objects and novel features of this invention will become obvious from the description of the specification and the accompanying drawings.

A typical aspect of performance of the present invention is summarized as follows:

Means for latching stored data is disposed outside non-volatile memory cells. Before simultaneous erasure, some of the stored data items of the non-volatile memory cells are transferred to and held in the latch means. The data items saved in the latch means are written again after the simultaneous erasure, or alternatively, data items in only regions designated by the data items transferred to the latch means or the other regions are simultaneously erased.

According to the expedient stated above, some of the stored data items can be written again after having been erased once, or the erasure of the designated regions can be inhibited after data protective information items have been written into the predetermined regions within the matrix of the non-volatile memory cells. With this measure, the overall and simultaneous erasure of the memory cell matrix is made possible, while the unlawful initialization of the memory cell matrix is prevented in such a way that the information for the data protection and data items to be checked from alterations after having been written once, e.g., serial No. and an identification code, can be conserved even in the case of the overall erasure, whereby the objects of making high degrees of secrecy protection possible can be accomplished in LSI's such as a non-volatile memory and a single-chip microcomputer with the non-volatile memory built therein.

BRIEF DESCRIPTION OF THE DRAWINGS

FIG. 3 is an arrangement diagram of an address decoder in the first embodiment;

FIGS. 4A thru 4D are time charts in the case of the overall erasure of the first embodiment;

FIG. 7 is an arrangement diagram of an address decoder in the second embodiment;

FIGS. 8A thru 8F are time charts in the case of the overall erasure of the second embodiment;

FIG. 9 is a fundamental arrangement diagram of a non-volatile memory to which the present invention is applied;

FIGS. 10A thru 10E are time charts in the case of the write operation of the memory in FIG. 9;

DESCRIPTION OF THE PREFERRED EMBODIMENTS

Figure 1A:
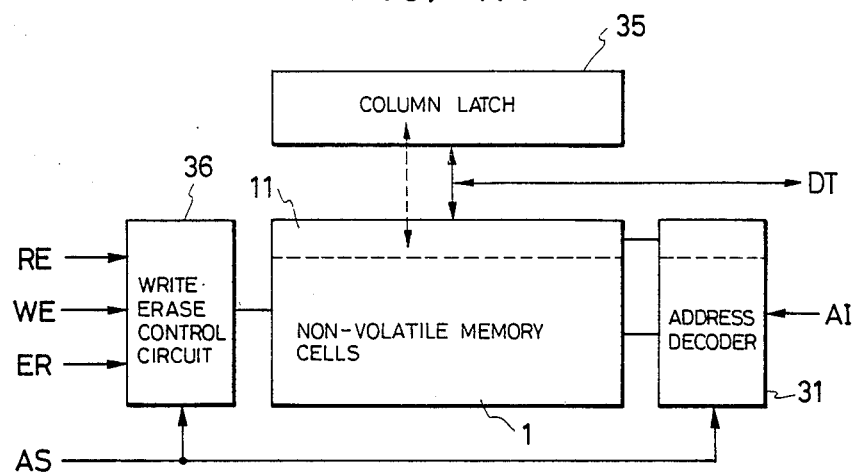
FIGS. 1A and 1B are block diagrams of non-volatile memories showing the outlines of the first embodiment and second embodiment of the present invention, respectively.

Before the description of practicable embodiments, the basic arrangement of an electrically writable and erasable non-volatile memory to which the present invention is to be applied will be first explained with reference to FIG. 9.

In FIG. 9, numeral 1 indicates a group of non-volatile memory cells in which non-volatile memory cells of, e.g., the MNOS (metal-nitride-oxide-semiconductor) type are arrayed in the shape of a matrix; numeral 31 an address decoder; numeral 35 a column latch circuit which is disposed every data line in the memory cell group 1; and numeral 36 a write/erase control circuit. Data is written or rewritten by applying address input signals AI to the address decoder 31, data signals DT to the memory cells 1, and a write enable signal WE to the write/erase control circuit 36, while read data DT is obtained by applying the address input signals AI and a read enable signal RE. The data of a designated address is erased by applying the address input signals AI and an erase enable signal ER. Further, the overall erasure of the memory cells 1 is performed by applying an all select signal AS to the address decoder 31 and the erase enable signal ER to the write/erase control circuit 36. Although no special restriction is meant, all word lines in the memory cell group 1 are simultaneously selected by the decoder 31 when the all select signal AS is applied thereto. In addition, the column latches 35 are disposed in correspondence with all the data lines, whereby data items can be collectively written every row address.

FIG. 10A–FIG. 10E are the time charts of a write or rewrite operation for the memory in FIG. 9.

As illustrated in FIG. 10A–FIG. 10E, the operation of writing data into the memory cells 1 is started by applying the address input signals AI as well as the data signals DT and also applying the write enable signal WE. First, the internal operation mode of the memory cell group 1 is brought into a read status by the write/erase control circuit 36, and all data items at a designated row address are fetched and saved in the column latches 35, while the data inputs are accepted, and the contents of the column latches 35 are rewritten according to input column addresses as well as the input data items. Although no special restriction is intended, the acceptance of the data input signals ends after the lapse of a fixed time interval, for example, 500 μsec, and the internal operation mode becomes an erase status in which all the memory cells corresponding to the designated row address are brought into erased conditions. Subsequently, the internal operation mode becomes a write status in which the contents of the column latches 35 are written into the memory cells corresponding to the designated row address. The reading—erasing —writing as stated above are carried out as a series of operations, whereby the collective writing of data in row address unit ends. A timer function, etc. necessary therefor are provided in the write/erase control circuit 36.

On the other hand, the operation of erasing data from the memory cell group 1 is started by applying the erase enable signal ER, and the internal operation mode becomes the erase status. Under this status, when the all select signal AS is in a "0" status, memory cells corresponding to a row address indicated by the address input signals AI are selected and erased, and when the all select signal AS is in a "1" status, all the memory cells are selected and erased.

Further, the erasure of some data items at a row address is carried out in such a way that, in the foregoing write operation, data "0" or "1" designated beforehand is written into addresses to-be-erased. That is, "0" is written when the erased condition of the address is designated as "0," and "1" is written when it is designated as "1."

Figure 1B:
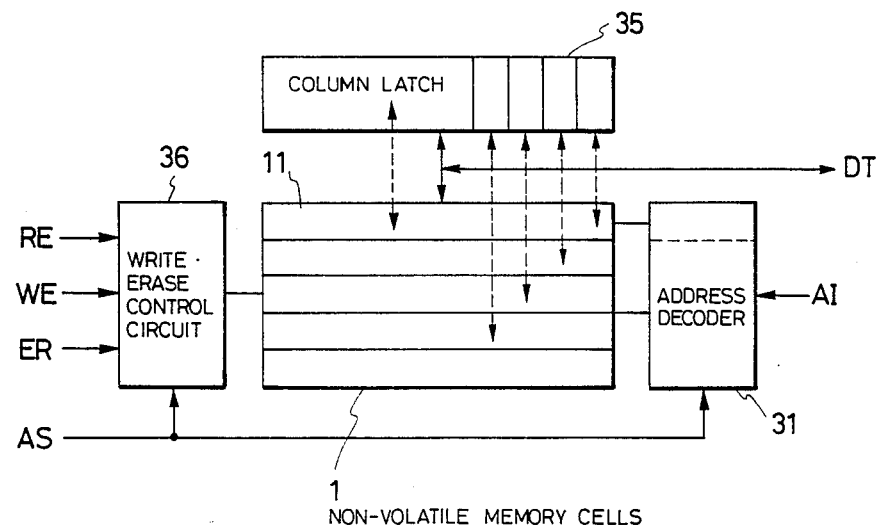

Examples in which the present invention is applied to the non-volatile memory of the arrangement as shown in FIG. 9 are illustrated in FIGS. 1A and 1B.

FIGS. 1A and 1B show the outlines of the first and second embodiments of a non-volatile memory according to the present invention, respectively.

Although not especially restricted, blocks depicted in FIG. 1A are formed on a single semiconductor chip by well-known semiconductor techniques. Likewise, blocks depicted in FIG. 1B are formed on a single chip.

In the memory (EEPROM) of the first embodiment shown in FIG. 1A, in a case where an erase enable signal ER is applied and where an all select signal AS is set at "1," a series of operations are executed as follows: First, data items at a previously-designated row address (for example, the first row 11 in FIG. 1A) in a group of non-volatile memory cells 1 are fetched and held in column latches 35. Subsequently, the overall and simultaneous erasure of the memory cell group 1 is performed. Thereafter, the contents of the column latches 35 are written into the row address 11 again.

That is, in this embodiment, in the case of the overall erasure, the reading—erasing—rewriting are carried out at the designated row address, and collective erasure is carried out at the other row addresses.

On the other hand, in the second embodiment shown in FIG. 1B, protective information in row address unit is put in a row address (for example, the first row 11) designated beforehand, and the data items of the designated row address are transferred to column latches 35 in an overall erase operation, whereby the erasure of the data items of some row addresses is checked on the basis of such protective information items.

Now, more practicable embodiments of the respective embodiments will be described.

Figure 2:
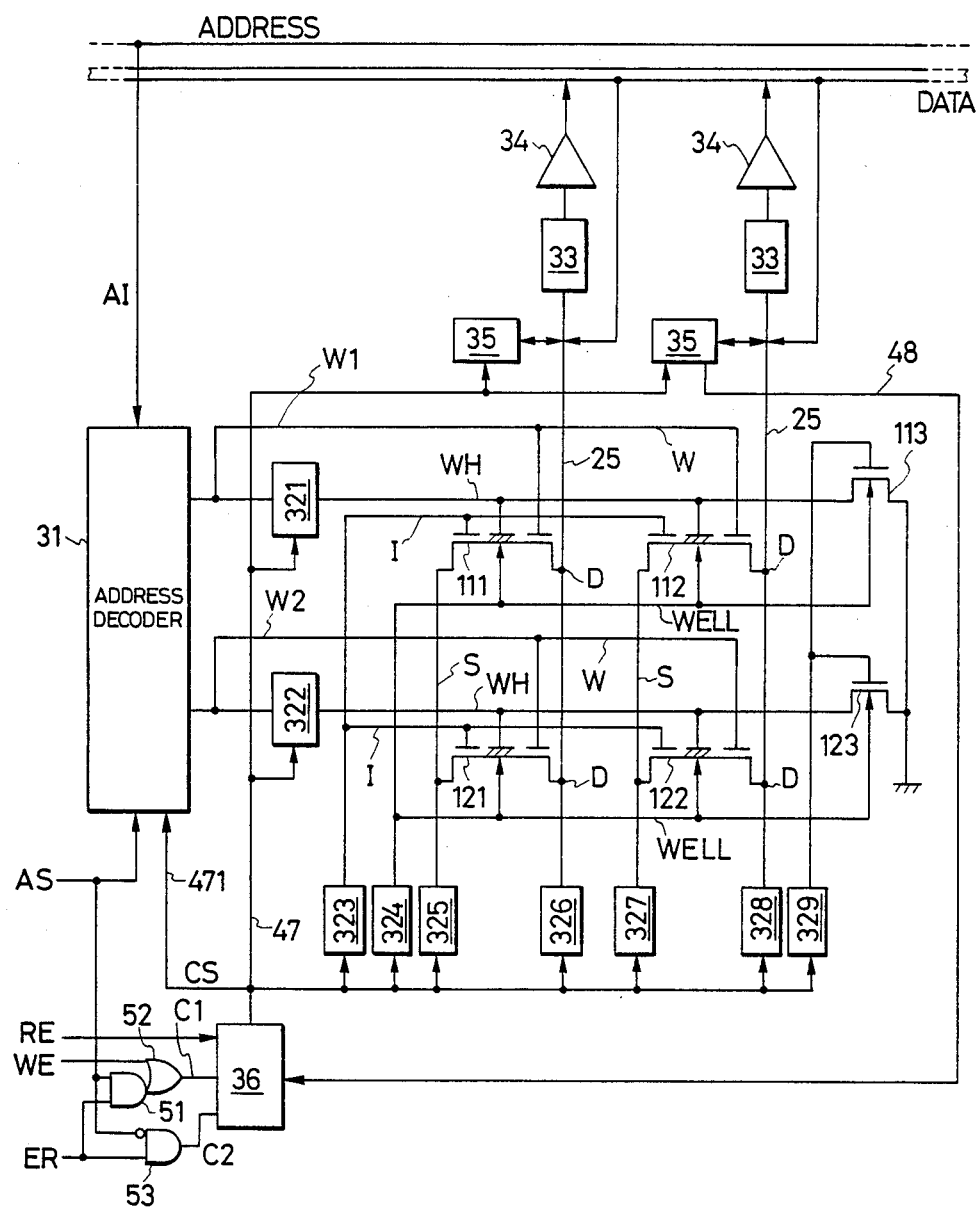
FIG. 2 is a circuit arrangement diagram showing the details of the first embodiment.

FIG. 2 is a detailed diagram of the memory in the first embodiment. Numeral 31 denotes an address decoder, numerals 321–329 high-voltage control circuits, numeral 33 a sense amplifier, numeral 34 an output buffer, numeral 35 the column latch, numeral 36 a write/erase control circuit, numerals 111, 112, 121 and 122 transistors which constitute the memory cells, and numerals 113 and 123 transistors which turn "on" and "off" the gate voltages of the memory cells. This embodiment is additionally provided with input logical gates 51–53 for the write enable signal WE and the erase enable signal ER which are applied to the write/erase control circuit 36 in the non-volatile memory of FIG. 9, a signal line 471 which supplies a control signal from the write/erase control circuit 36 to the address decoder 31, and a line 48 for a control signal from the column latch 35 to the write/erase control circuit 36.

In the memory of FIG. 2, voltage conditions as listed in Table 1 are afforded to the sources S, isolated gates I, high-voltage word lines WH, selection word lines W, drains D and well regions WELL of the memory cells 111, 112, 121 and 122, whereby the operations of reading out data, writing "0" or "1" and erasing data are carried out.

TABLE 1

|  |  | Source S | Isolated gate I | High-voltage word line WH | Word line W | Drain D | Well WELL |
|---|---|---|---|---|---|---|---|
| Read | Selected | 0 | $V_{cc}$ | 0 | $V_{cc}$ | $D_{out}$ | 0 |
|  | Unselected | 0 | $V_{cc}$ | 0 | 0 | HiZ | 0 |
| Write "0" | Selected | $V_{cc}$ | $-V_{pp}$ | $V_{cc}$ | $V_{cc}$ | $-V_{pp}$ | $-V_{pp}$ |
|  | Unselected | $V_{cc}$ | $-V_{pp}$ | $-V_{pp}$ | 0 | $-V_{pp}$ | $-V_{pp}$ |
| Write "1" | Selected | $V_{cc}$ | $-V_{pp}$ | $V_{cc}$ | $V_{cc}$ | $V_{cc}$ | $-V_{pp}$ |
|  | Unselected | $V_{cc}$ | $-V_{pp}$ | $-V_{pp}$ | 0 | $V_{cc}$ | $-V_{pp}$ |
| Erase | Selected | $V_{cc}$ | $V_{cc}$ | $-V_{pp}$ | $V_{cc}$ | $V_{cc}$ | $V_{cc}$ |
|  | Unselected | $V_{cc}$ | $V_{cc}$ | $V_{cc}$ | 0 | $V_{cc}$ | $V_{cc}$ |

More specifically, in case of the read operation, a power source voltage $V_{cc}$ (for example, 5 V) is applied to the word line W by the address decoder 31, and the high-voltage word line WH is set at 0 V through the high-voltage control circuit, thereby to select the memory cells, the contents ($D_{out}$) of which are fetched from the drains D to data lines 25. Besides, in case of the write operation, the voltage $V_{cc}$ is applied to the word line W by the address decoder 31, the same voltage $V_{cc}$ is applied from the high-voltage control circuit 321 or 322 to the high-voltage word line WH, a minus high voltage $-V_{pp}$ (for example, $-12$ V) is applied from the high-voltage control circuit 324 to the well WELL, and the voltages $-V_{pp}/V_{cc}$ are respectively applied to the data lines (D) in accordance with write data items "0"/"1," whereby "0"/"1" can be written into selected memory cells.

Besides, in case of the erase operation in row address unit, the voltage $V_{cc}$ is applied to one of the word lines W corresponding to an address by the address decoder 31, the voltage $-V_{pp}$ is applied from the high-voltage control circuit 321 or 322 to one of the high-voltage word lines WH corresponding to the address, and the voltage $V_{cc}$ is applied from the high-voltage control circuit 324 to the well WELL, whereby the contents of selected memory cells are erased. In the write or rewrite operation of this memory, though no special restriction is meant, fetching the contents of the designated row address to save them in the column latches 35, rewriting the contents of the column latches 35, erasing the contents of the selected row address, and writing the contents of the column latches 35 into the selected row address are performed as a series of operations under the control of the write/erase control circuit 36 in the same manner as in the circuit shown in FIG. 9.

When compared with the fundamental device of FIG. 9, the present embodiment is so constructed that the logical gates 51–53 are further added and that the write/erase control circuit 36 controls also the address decoder 31. In case of overall and simultaneous erasure, the memory is so controlled that the data items of a previously-designated row address are saved in the column latches before the erase operation and that the contents of the column latches are written into the row address after the erase operation.

More specifically, when both an all select signal AS and the erase enable signal ER are set at "1" in order to execute the overall and simultaneous erasure in the device of FIG. 2, a control signal C1 through the logical gates 51 and 52 becomes "1," and a control signal C2 through the logical gate 53 becomes "0," so that an operation similar to the write or rewrite operation stated before is instructed to the write/erase control circuit 36. Thus, the internal operation of the memory becomes the series of operations of saving—erasing—writing.

FIG. 3 shows the arrangement of the principal portions of the address decoder 31 in the present embodiment.

AI stands for address input signals, AS the all select signal, and CS the control signal which is output from the write/erase control circuit 36 to the address decoder 31 through the signal line 471. When the memory is in the ordinary operation, that is, when the all select signal AS is in a "0" status, a signal for selecting the word line W1 or W2 is formed according to the address input signals AI by gates 311 and 312. The first row address designated beforehand is a row address corresponding to the word line W1, and it is selected whenever the memory is in the overall and simultaneous erase operation, that is, whenever the all select signal AS is in the status of logic "1." On the other hand, the control signal CS which is supplied from the write/erase control circuit 36 to this address decoder through the signal line 471 is prescribed so as to become "1" only in the erase operation and to become "0" in the save operation and the write operation. In the all select status, accordingly, a row address corresponding to the word line W2 is selected in only the erase operation, so that only the erasure of the data items of the address is carried out.

FIGS. 4A–4D show the time charts of the overall and simultaneous erase operation in the present embodiment.

In the overall and simultaneous erase operation, saving the contents of the first row address in the column latches 35, simultaneously erasing the contents of all the non-volatile memory cells of the cell group 1 and rewriting the contents of the column latches 35 into the designated row address (first row address) are performed as a series of operations in accordance with the control of the write/erase control circuit 36, thereby making it possible to conserve the contents of the designated row address. That is, the word line W1 of the first row is held in the selected status (level "1") continually throughout the overall erase operation, and the word line W2 of the second row is held at the select level during only the erase operation.

Although not especially restricted, the memory may well be so constructed that data inputs are accepted in the save operation and that the contents saved in the column latches 35 are written again. Alternatively, it may well be so constructed that the data inputs are inhibited, in other words, that the rewriting is inhibited. This construction will be appropriate in cases where the stored contents require the protection of secrecy.

Further, although not especially restricted, the embodiment in FIG. 2 is so constructed that protective information is included in the contents saved in the column latches 35, and that whether or not the saved contents are rewritten after the overall and simultaneous erasure is selected according to the content of the protective information. More specifically, the protective information is stored in the memory cell 112, and the data held in the column latch 35 corresponding to the memory cell 112 is supplied to the write/erase control circuit 36 by the signal line 48 so as to make the operation thereof different. By way of example, when the content of the memory cell 112 is "0," it brings the signal line 48 to "0" and instructs the write/erase control circuit 36 to rewrite the saved contents, and when the content of the memory cell 112 is "1," it instructs the control circuit 36 to end the operation thereof with the overall and simultaneous erasure and to perform no rewriting.

Figure 5:
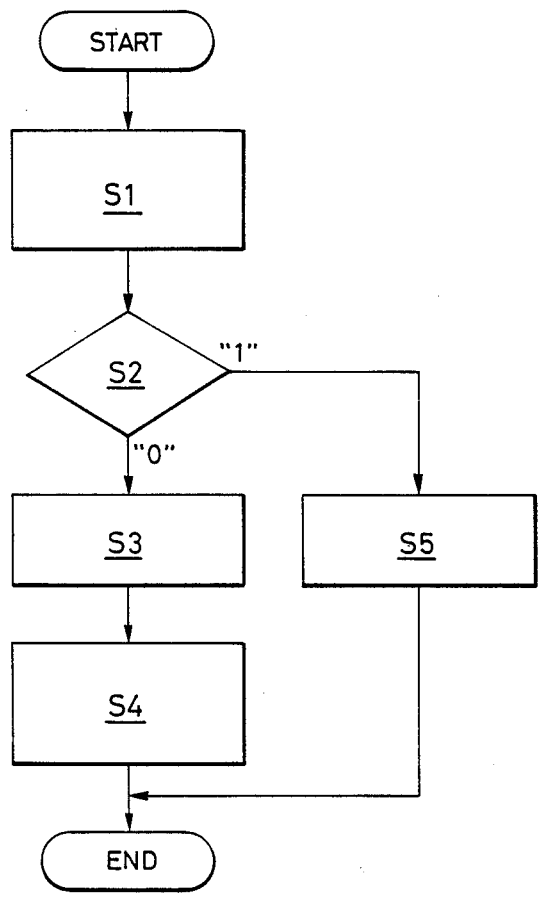
FIG. 5 is a flow chart in the case of the overall erasure of the embodiment in FIG. 2.

FIG. 5 shows the flow chart of a control process which is executed by the write/erase control circuit 36 in the overall and simultaneous erase operation of the present embodiment.

As illustrated in the figure, in the overall erasure, the contents of a designated address are first saved in the column latches at a step S1. Subsequently, whether protective information is "0" or "1" is decided at a step S2. If the decided result is "0," all the memory cells are simultaneously erased at a step S3. Thereafter, the contents of the column latches are written into the designated address again at a step S4. In contrast, if the decided result at the step S2 is "1," the control process shifts to a step S5 and ends upon performing only the overall and simultaneous erasure.

Incidentally, erasure in word line unit (row address unit) can be performed in the same manner as in FIG. 9.

According to the present embodiment, even a non-volatile memory capable of only the overall and simultaneous erasure is permitted to conserve some of stored contents in case of an erase operation.

Further, a memory capacity in which the stored contents are conservable can be increased in such a way that a plurality of column latch trains are provided and that the save and rewrite operations described before are carried out a plurality of times.

By the way, the embodiment fails to conserve the stored contents in a case where the power source voltage lowers or is cut off after the start of the overall and simultaneous erasure and before the end of the rewriting. In order to cope with this situation, a capacitor for backup is provided so as to hold necessary electric power therein, whereby the memory keeps operating even after the lowering or cutoff of the power source voltage, and the conservation can be effected. Alternatively, a non-volatile memory cell is further provided outside the group of memory cells 1, and only the fact of the occurrence of the lowering or cutoff of the power source voltage before the end of the writing is recorded in the non-volatile memory cell so as to inhibit all the subsequent operations. With this construction, the capacity of the capacitor can be made small, and the protection of secrecy can be achieved. However, a period of time required for the erasing and the writing is 10–50 msec, and the lowering or cutoff of the power source voltage will, in general, pose no problem.

Figure 6:
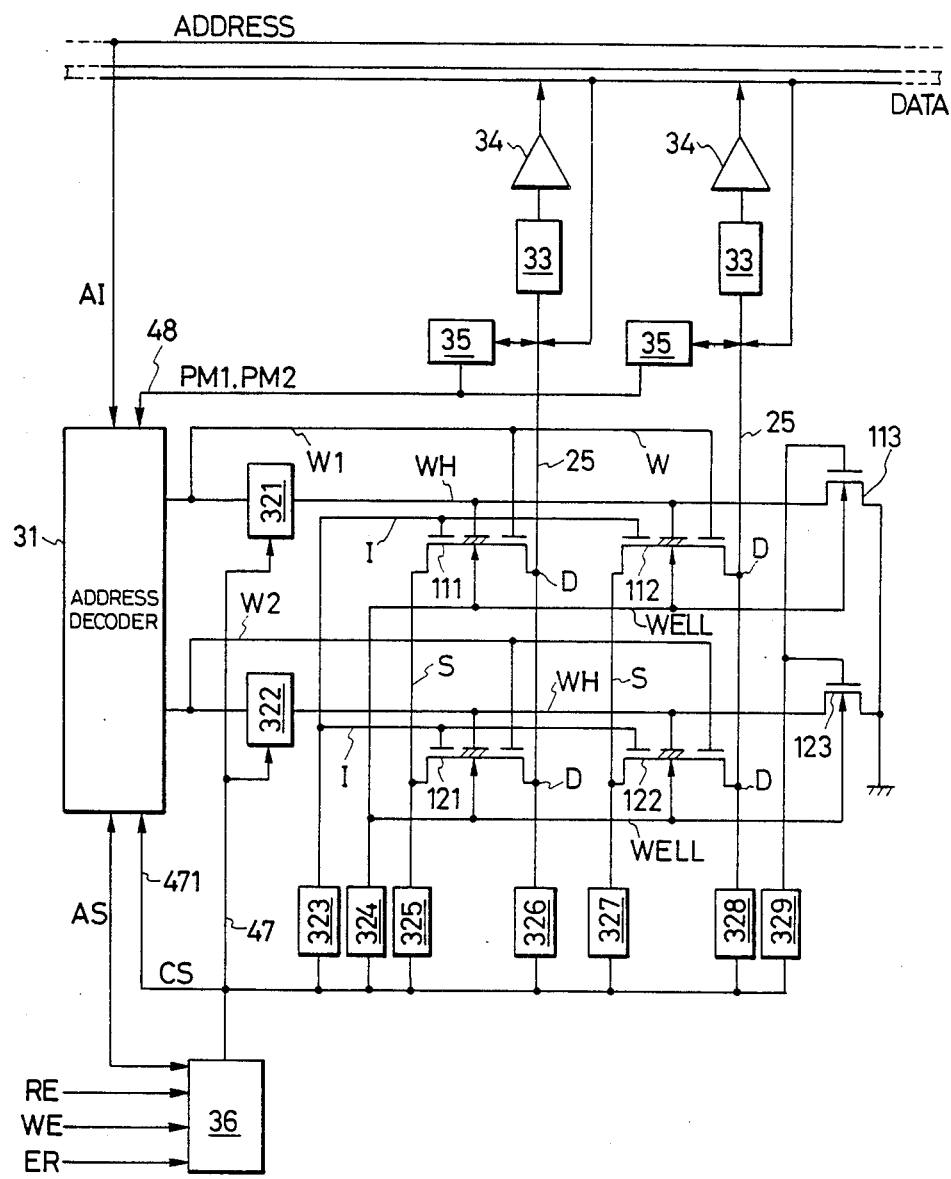
FIG. 6 is a circuit arrangement diagram showing the details of the second embodiment.

FIG. 6 is a block diagram of a non-volatile memory showing a practicable example of the second embodiment depicted in FIG. 1B.

In the present embodiment, the logical gates 51–53 illustrated in the embodiment of FIG. 2 are removed, and the all select signal AS is input directly to the write/erase control circuit 36. When the all select signal AS of "1" level and the erase enable signal ER of "1" level are externally applied for the overall and simultaneous erasure, the internal operation mode is first brought into the read status, and the contents of the first row address are transferred to the column latches 35 as in the first embodiment. Protective information items in row address unit are stored in the first row address, and the data items held in the column latches 35 are input to the address decoder 31 through the signal line 48 as erase permit signals. Thereafter, the internal operation mode becomes the erase status, and only row addresses designated according to the erase permit signals are erased. Herein, the rewrite operation is not carried out. In case of applying this embodiment, in order to prevent the illicit use of the EEPROM, the protective information items of the first row address may be set at "1" without fail by an IC manufacturer or card manufacturer so as to prevent the erasure.

FIG. 7 shows the arrangement of the principal portions of the address decoder 31 in the present embodiment.

AI stands for address input signals, AS the all select signal, CS a control signal which is output from the write/erase control circuit 36, and PM1 and PM2 the erase permit signals which are output from the column latches 35.

The control signal CS which is supplied from the write/erase control circuit 36 to the address decoder 31 is set at "1" in only the erase operation on the basis of the erase enable signal ER as in the first embodiment. Besides, the erase permit signals PM1 and PM2 are formed on the basis of the protective information items held in the column latches 35 after the data items have been saved in the column latches 35 in the case of the overall erasure, and they determine whether or not the contents of the first row address and the second row address are to be erased, respectively. Although not especially restricted, the permit signals PM1 and PM2 are validated to become "0" or "1" in the erase operation, and they are fixed to "1" at any other time.

When the permit signals PM1 and PM2 are "0," the corresponding word lines are not selected in the address decoder of FIG. 7, and no erasure is performed. Thus, selective erasure according to the protective information items in the first row address is executed in the overall erase operation.

FIGS. 8A–8F show the time charts of the simultaneous erase operation in the present embodiment.

In accordance with the control of the write/erase control circuit 36, the internal operation of the memory is first brought into a read mode in which the contents of the first row address are transferred to the column latches 35. Under this status, only the word line W1 is selected. Subsequently, an erase operation mode is established, and the word lines for which the erase permit signals delivered from the column latches 35 are "1" are selected and erased. When the corresponding erase permit signal is "0," the word line is unselected and is checked from erasure, so that the stored contents of the memory cells belonging to the word line are conserved.

According to the present embodiment, the erasure of memory cell arrays of any desired addresses and any desired capacity can be withheld in row address unit so as to conserve the stored contents of the memory cell arrays even after the simultaneous erase operation, so that more multifarious requests can be complied with.

In addition, the protective information items need not correspond to the row addresses in one-to-one relation, but by way of example, protective information of 1 bit may be used for determining whether or not the stored contents of a plurality of row addresses are to be conserved. Thus, a memory capacity required for storing the protective information can be decreased.

Further, in the second embodiment, the row addresses at which the stored contents are to be conserved by storing the protective information items in the first row address may well be fixed. An example of a method therefor is that, in the arrangement of FIG. 7, the erase permit signal PM1 or PM2 corresponding to the word line for the conservation is fixed to "0" by the alteration of wiring, or the like in a manufacturing process. In such a case, the save operation of the first row address preceding the simultaneous erasure is dispensed with, and the arrangement of the memory can be simplified more.

As described above, in the first embodiment, means for latching stored data is disposed outside a group of non-volatile memory cells, some of the stored data items of the non-volatile memory cells are transferred to and conserved in the latch means before simultaneous erasure, and the saved data items are written again after the simultaneous erasure. Therefore, owing to the function that the data items saved before the overall erasure are conserved even after the erasure, the embodiment produces the effects that the overall and simultaneous erasure of the memory cells is possible, and that the unlawful initialization of the memory cell matrix is prevented, while information for data protection and data items such as serial No. and an identifying code, which are to be checked from alterations after having been once written, can be conserved even in the case of the overall erasure, whereby a high degree of secrecy protection is realized.

On the other hand, in the second embodiment, means for latching stored data is disposed outside a group of non-volatile memory cells, and on the basis of the data items transferred to the latch means, only regions designated by these data items or the other regions are simultaneously erased. Therefore, owing to the function that after the data protection information items have been written into a predetermined region within the group of non-volatile memory cells, the erasure of the designated regions can be inhibited, the embodiment produces the effect that the unlawful initialization of the memory cells is prevented, while the information for data protection and data items such as serial No. and an identifying code, which are to be checked from alterations after having been once written, can be conserved even in the case of the overall erasure, whereby a high degree of secrecy protection is realized.

Although, in the above, the invention made by the inventors have been concretely described in conjunction with embodiments, it is needless to say that the present invention is not restricted to the foregoing embodiments but that it can be variously modified within a scope not departing from the purport thereof.

By way of example, although the above description has principally referred to the cases of applications to non-volatile memories capable of writing and erasing in row address unit, the invention is not restricted thereto but the unit of the writing and erasing may be any as long as an electrically writable and erasable non-volatile memory, namely, an EEPROM capable of electrical overall and simultaneous erasure is concerned. In addition, the units of the writing and the erasing may well be different. At least the first embodiment is applicable to this occasion.

Moreover, column latches need not be disposed in correspondence with all data lines, and any means adapted to perform operations similar to those of the column latches may be used. The practicable circuits of respective circuit blocks may well be replaced with any means adapted to perform similar operations.

Furthermore, although the two embodiments have been described as to the memories in each of which a group of non-volatile memory cells are configured into a matrix of $2 \times 2$ cells, the invention is applicable to a memory which has a group of non-volatile memory cells configured of columns and rows in any desired numbers, e. g., $256 \times 256$.

Figure 11:
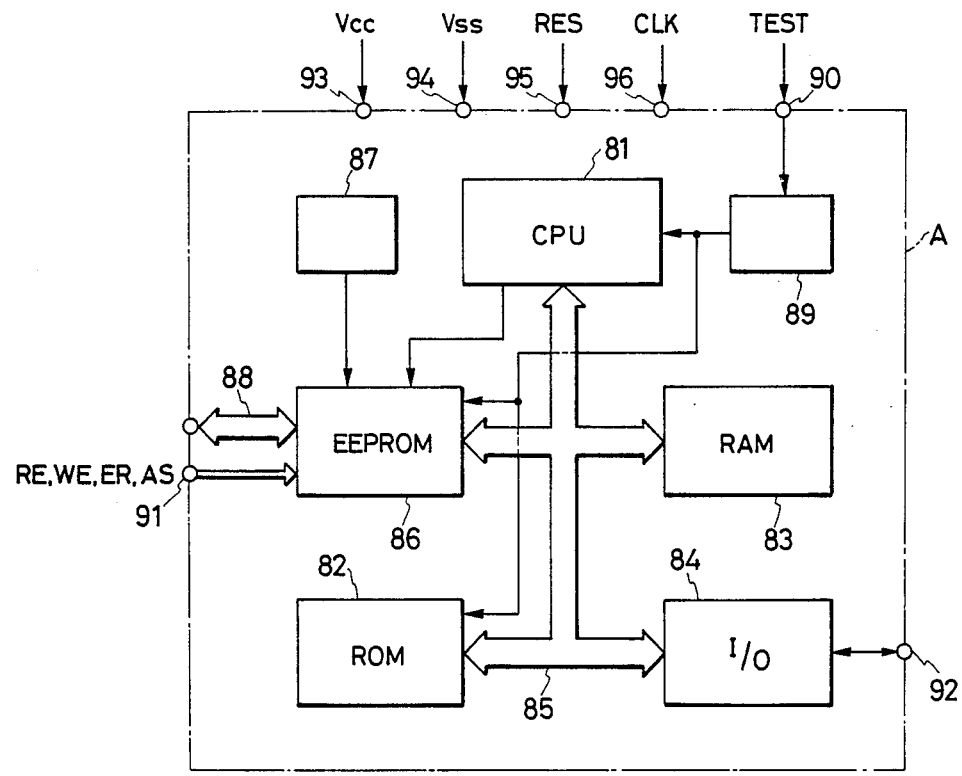
FIG. 11 is a block diagram showing the third embodiment of an EEPROM according to the present invention.

FIG. 11 shows the third embodiment of the present invention. This embodiment is a single-chip microcomputer for an IC card in which the EEPROM of the first or second embodiment stated above is built.

Although not especially restricted, various circuit blocks enclosed with a dot-and-dash line A in the figure are formed on one semiconductor chip such as single-crystal silicon substrate.

Although no special restriction is meant, the single-chip microcomputer of this embodiment includes a microprocessor unit (hereinbelow, termed "CPU") 81 which controls the internal execute unit etc. thereof in accordance with programs so as to perform desired processes, a read only memory (ROM) 82 in which the operation program of the CPU 81, etc. are stored, a random access memory (RAM) 83 which principally offers the working area of the CPU 81, and a serial communication interface 84 which sends and receives data to and from an external apparatus such as terminal equipment, these circuits being interconnected through an internal system bus 85.

In this embodiment, the read only memory 82 is constructed of an unrewritable masked ROM into which data is written by masking in the course of a manufacturing process. An EEPROM 86 in which data items proper to a user, such as the money information of a bank and the identifying code of the individual, are stored, and a booster circuit 87 which generates a write voltage $V_{pp}$ required in the operation of writing the data items into the EEPROM 86, are packaged on the chip A separately from the masked ROM 82.

The EEPROM 86 is so constructed that it can be usually accessed by only the CPU 81. For the purpose of permitting a manufacturer side to test the EEPROM 86 in a short time, however, the IC card is provided with a testing bus 88 separately from the internal system bus 85, and with a mode setting circuit 89 for making it possible to access the EEPROM 86 from outside directly without the intervention of the CPU 81 in accordance with an external control signal TEST and by the use of the testing bus 88, as well as a terminal 90 for inputting the mode control signal TEST.

This terminal 90 for mode control, and a terminal 91 for inputting a read enable signal RE, a write enable signal WE, an erase enable signal ER and an all select signal AS for the testing bus 88 as well as the EEPROM 86, are not connected to external terminals as the IC card. Connected to the external terminals of the IC card are only five terminals; an I/O terminal 92 for serial communications, power source terminals 93 and 94 for applying power source voltages $V_{cc}$ and $V_{ss}$ to the chip, respectively, an input terminal 95 for a reset signal RES, and an input terminal 96 for a clock CLK.

Accordingly, after the single-chip microcomputer of this embodiment has been encapsulated in the IC card, the EEPROM 86 cannot be directly accessed using the testing bus 88.

Moreover, when the EEPROM 86 is so constructed that some of data items can be conserved by rewriting even in the overall erasure mode as in the foregoing embodiment, the unlawful initialization of the EEPROM cannot be performed. Thus, it is possible to prevent the illicit use of the IC card ascribable to the alterations of the important data items in the EEPROM, such as money information and identifying code.

The ROM 82 stores therein the instructions or programs according to which the CPU 81 executes the rewriting of data for the EEPROM 86 in the ordinary operation modes. In this regard, by partly modifying the address decoder of the EEPROM 86 by way of example, the IC card can also be so constructed that the CPU 81 cannot access the first row address or a designation row address containing protective information. The control signals such as the read enable signal RE, write enable signal WE and erase enable signal ER, which are required when data items are read out of and written into the EEPROM 86 by the CPU 81 in the ordinary modes, are afforded from the CPU 81 to the EEPROM 86.

Although the embodiment has been described as to the case where the single-chip microcomputer with the built-in EEPROM is used for the IC card, a microcomputer for a card can also be constructed by combining an EEPROM chip with a single-chip microcomputer in which a ROM and a RAM are built.

Figure 12:
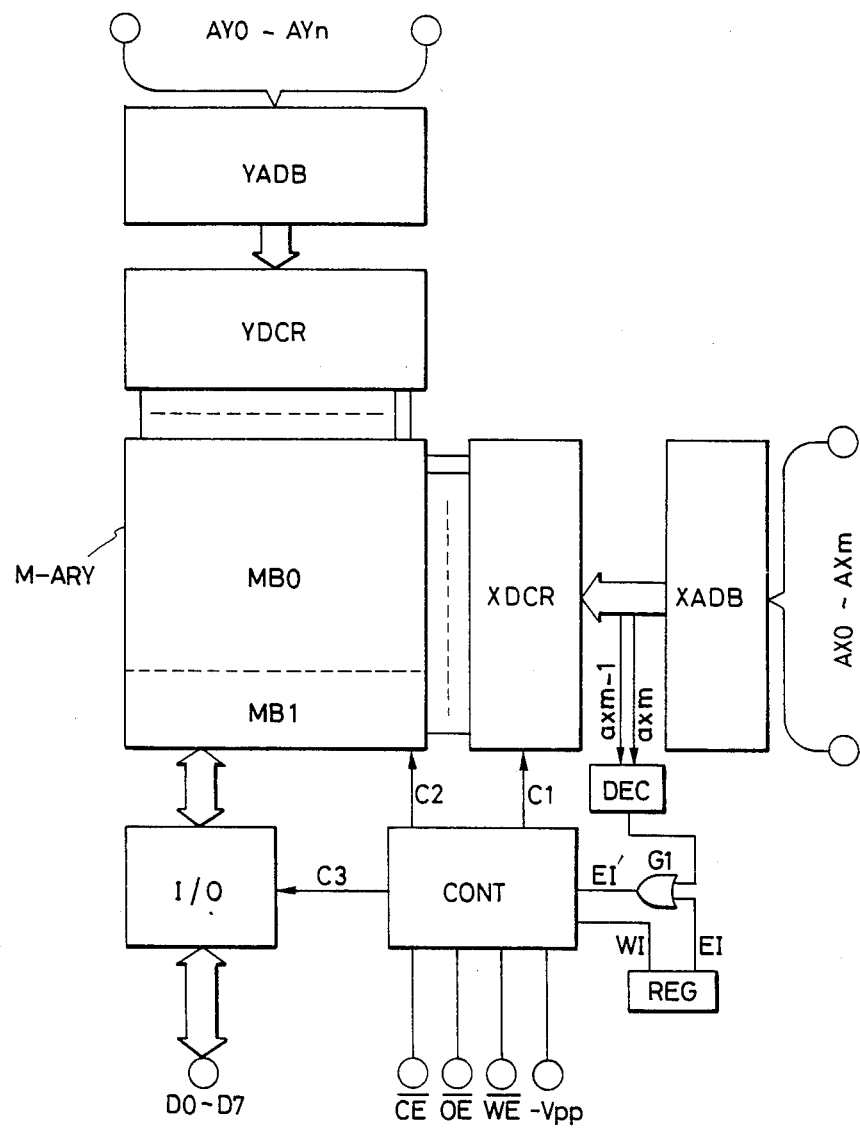
FIG. 12 is a block diagram showing the fourth embodiment of the present invention.

FIG. 12 shows a block diagram of an EEPROM device which is the fourth embodiment of this invention. Using the known manufacturing techniques of semiconductor integrated circuits, various circuit blocks in the figure are formed on a single semiconductor substrate such as single-crystal silicon though this is not especially restrictive.

A memory array M-ARY is divided into a memory block MB0 which is enabled to write and rewrite (also erase) data in ordinary operating statuses, and a memory block MB1 which is inhibited from writing and erasing data. The memory block MB1 is used as a storage area for data to-be-protected by having the write and erase operations inhibited as stated above. As will be described later, the memory array M-ARY includes a plurality of non-volatile memory cells which are arranged in the shape of a matrix, a plurality of word lines which are laterally extended, and a plurality of data lines which are vertically extended. In this embodiment, the memory blocks MB0 and MB1 are so defined that some of the plurality of word lines belong to the memory block MB0, while the others belong to the memory block MB1.

Although not especially restricted, address signals which are supplied from external terminals AX0–AXm are fed to an X-address buffer XADB. Upon receiving the address signals supplied from the external terminals, the X-address buffer XADB forms complementary internal address signals which consist of internal address signals inphase with the received signals and internal address signals antiphase thereto and which are supplied to an X-address decoder circuit XDCR. Besides, the address buffer XADB transmits predetermined address signals to a decoder DEC in order to identify accesses to the memory blocks MB0 and MB1. By way of example, in a case where the memory array M-ARY is divided in four in an X-direction and where three of the four divided memory areas are allotted to the memory block MB0, while the remaining one is allotted to the memory block MB1, the X-address signals axm and axm-1 of the upper 2 bits are supplied to the decoder DEC and decoded therein.

The X-address decoder circuit XDCR decodes the complementary internal address signals, and performs the operation of selecting one of the word lines. In the erase and write operations thereof, the non-volatile memory cell requires comparatively high voltages which differ from a voltage for the read operation thereof. Therefore, the X-address decoder circuit XDCR decodes the internal complementary address signals, and in accordance with a control signal C1 (or control signals) supplied from a control circuit CONT, it selects the word line of the memory array M-ARY under the state of the comparatively high voltage in the erase or write operation and brings the same into a selected status under the state of the comparatively low voltage in the read operation.

Although not especially restricted, address signals which are supplied from external terminals AY0–AYn are fed to a Y-address buffer YADB. Upon receiving the address signals supplied from the external terminals, the Y-address buffer YADB forms complementary internal address signals which consist of internal address signals inphase with the received signals and internal address signals antiphase thereto and which are supplied to a Y-address decoder circuit YDCR. The Y-address decoder circuit YDCR decodes the complementary internal address signals, and performs the data line select operation of connecting at least two of the data lines to an input/output circuit I/O in order to write/read data in plural-bit unit. It is to be understood that, for this purpose, the memory array M-ARY includes a Y-gate or column switch circuit by which two or more of the data lines are selectively connected to a plurality of common data lines connected to the input- /output circuit I/O. Since the non-volatile memory cell needs to supply a comparatively high voltage to the data lines in the write operation thereof, the Y-address decoder circuit YDCR has the function of forming select signals at the high voltage.

The input/output circuit I/O includes a writing circuit which receives write signals supplied from external terminals D0–D7 in, for example, 8-bit unit and transmits them to the data lines to-be-selected, and a reading circuit by which data items read out in 8-bit unit are delivered to the external terminals D0–D7. The writing circuit and reading circuit included in the input/output circuit I/O are selectively brought into an operating status in accordance with a control signal C3 (or control signals) which is supplied from the control circuit CONT.

Basically, the control circuit CONT receives control signals supplied from external terminals, for example, a chip enable signal $\overline{CE}$, an output enable signal $\overline{OE}$ and a write enable signal $\overline{WE}$, as well as a writing high voltage $\times V_{pp}$, and it identifies an operation mode and generates control signals and timing signals corresponding thereto. In this case, when the write mode is instructed by the combination of the control signals $\overline{CE}$, $\overline{OE}$ and $\overline{WE}$, the control circuit CONT executes the following three operations in time series before the execution of the operation of writing data items into memory cells, though they are not especially restrictive: They are the first operation in which the stored information items of memory cells belonging to a word line to be selected are fetched and are held in latch circuits disposed in correspondence with data lines, the second operation in which the data items to be written are substituted into the latch circuits, and the third operation in which the erase operations of the memory cells corresponding to the word line are performed. Thereafter, it is carried out as the fourth operation that the data items held in the latch circuits are actually written into the memory cells corresponding to the word line. To this end, the control circuit CONT includes a timer circuit for executing the respective operations time-serially. Owing to such operations, the EEPROM can be externally accessed similarly to a static RAM.

In this embodiment, a register REG is disposed in order to add the function of selectively inhibiting the operations of erasing and writing data from and into the memory blocks MB0 and MB1 as described above. Although not especially restricted, the register REG has 2-bit stored information consisting of a write inhibit signal WI and an erase inhibit signal EI. The write inhibit signal WI is supplied to the control circuit CONT. Even when the write enable signal $\overline{WE}$ supplied from the external terminal to the control circuit CONT is at a low level instructive of the write operation, this control circuit CONT invalidates the acceptance of the supplied signal in a case where the write inhibit signal WI indicates a status inhibiting the write operation. That is, the write inhibit signal WI is preferred to the write enable signal $\overline{WE}$. The erase inhibit signal EI and the output signal of the decoder DEC are supplied to an OR gate circuit G1. The output signal EI' of the OR gate circuit G1 is supplied to the control circuit CONT. In a case where this signal EI' indicates a status inhibiting the erase operation, the control circuit CONT does not execute the erase operation even when the erase mode is instructed by the combination of the control signals or when the erase operation during the write operation stated before is encountered.

An address selection circuit and a data input circuit for the register REG are omitted from the illustration. By way of example, the register REG is selected by setting one or more specified address terminals at a level higher than the ordinary high level, and the information items to be held are supplied from any two of the data terminals D0 thru D7. By setting the address terminal or terminals at the voltage higher than the ordinary high level as stated above, the assignment of a special address to the register REG is dispensed with in an arrangement for designating this register REG, and the operation of selecting the register can be distinguished from the select operation of the memory array M-ARY. Incidentally, when the register REG is selected by setting the address terminal or terminals at the high voltage, the select operation of the memory array M-ARY is inhibited. Alternatively, the control signals WI and EI may well be supplied from external terminals. Further, in a case where the EEPROM is built in a microcomputer of single chip, the control signals WI and EI can be supplied from the predetermined register of the microcomputer.

The control signals WI and EI are basically signals which instruct the write inhibit and erase inhibit for all the cells of the memory array M-ARY without the distinction between the memory blocks MB0 and MB1. In the ordinary operating statuses, therefore, both the signals WI and EI are held in reset statuses (logic "0"). The controls with such signals WI and EI are effective for, e.g., the overall protection of the stored data items of the memory array M-ARY in a specified operating status. Further, although not illustrated in the figure, a read inhibit signal RI may well be provided in the register REG at need, thereby to add the function of selectively inhibiting the read operation. Regarding this function of selectively inhibiting the read operation, reading data items which need to be kept secret can be inhibited in such a way that an identifying code, for example, is included in a procedure for clearing the read inhibit signal (for establishing a readable status).

Figure 13:
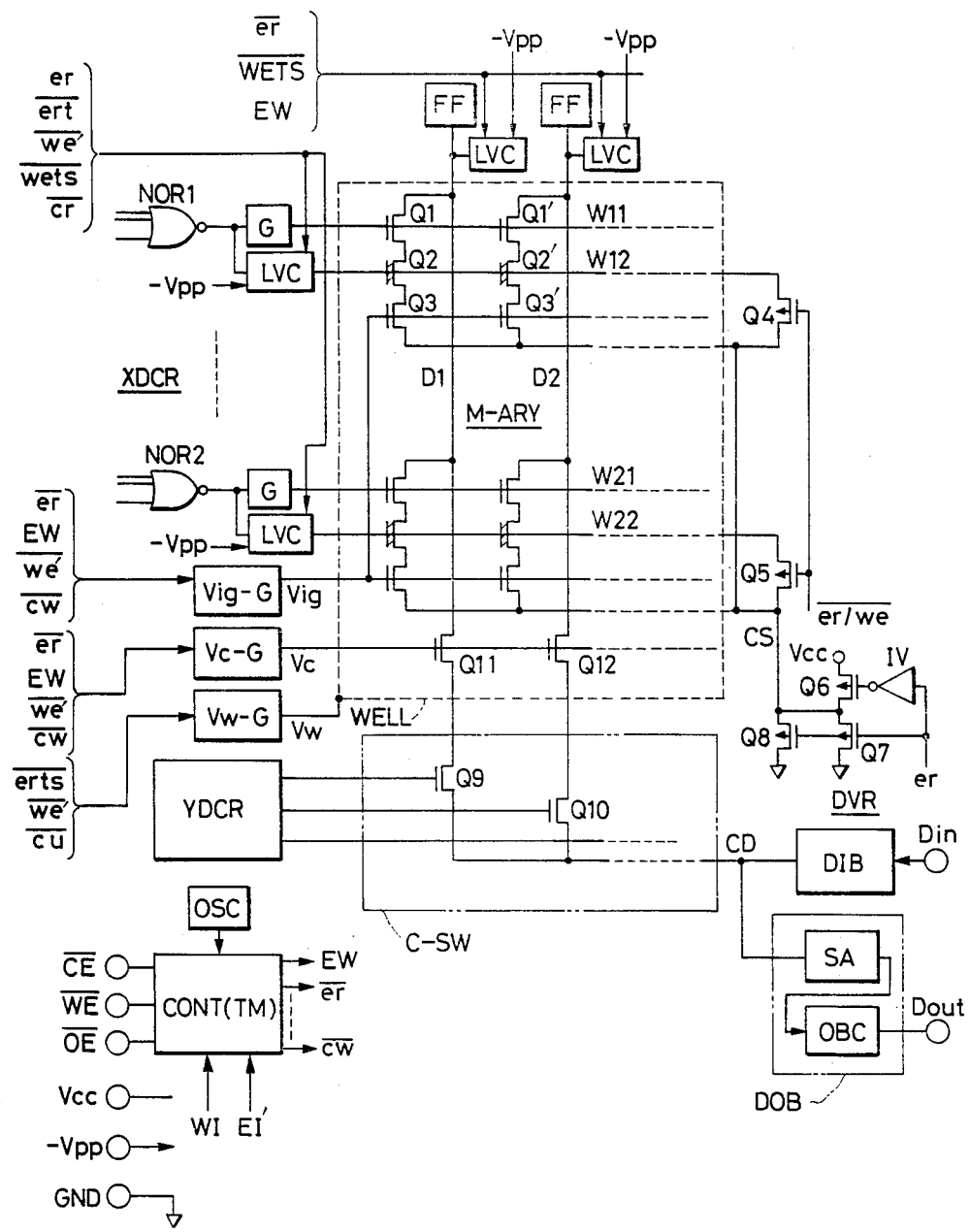
FIG. 13 is a detailed circuit diagram of the fourth embodiment.

FIG. 13 shows a circuit diagram of one embodiment of the memory array M-ARY as well as the decoder circuit of the EEPROM illustrated in FIG. 12.

In order to facilitate the ensuing description, FIG. 13 depicts only one input terminal $D_{in}$, only one output terminal $D_{out}$ and circuit portions associated with them. Although the other seven input and output terminals and circuit portions associated therewith are not shown, they have arrangements similar to those depicted in FIG. 13. In this regard, however, the control circuit CONT and an oscillator circuit OSC are common to the eight unit portions (each of which is constructed of the input terminal, the output terminal and the associated circuit portions).

Although not especially restricted, the EEPROM device is operated by a comparatively low power source voltage $V_{cc}$ of, e.g., +5 V and a minus high voltage $-V_{pp}$ of, e.g., −12 V which are supplied from outside the device. The X-address decoder XDCR, etc. constituting the selection circuit are constructed of CMOS circuits. The CMOS circuits are operated by being fed with the comparatively low power source voltage $V_{cc}$ of, e.g., +5 V. Accordingly, select/unselect signals which are formed by the address decoders XDCR and YDCR have their high level set at substantially +5 V and their low level set at substantially 0 V being the ground potential of the circuitry.

The structures of elements themselves constituting the illustrated EEPROM device are not directly pertinent to the present invention and are therefore omitted from the drawings, but they will now be outlined.

The whole illustrated device is formed on a semiconductor substrate made of, e.g., N-type single-crystal silicon. An MNOS transistor is of the N-channel type, and it is formed on a P-type well region or P-type semiconductor region formed in the surface of the semiconductor substrate. An N-channel type MOSFET is similarly formed on the P-type semiconductor region. A P-channel type MOSFET is formed on the semiconductor substrate. Although not especially restricted, one memory cell is constructed of one MNOS transistor and two MOSFET's connected in series therewith. In each memory cell, the MNOS transistor and the two MOSFET's are configured into, for example, a so-called stacked gate structure in which the gate electrodes of the two MOSFET's overlap the gate electrode of the MNOS transistor, respectively. Thus, the MNOS transistor and the two MOSFET's constituting the memory cell are, in effect, made a unitary structure, so that the size of the memory cell is reduced.

Although not especially restricted, the memory cells are formed on a common well region. An N-channel MOSFET for constructing the CMOS circuit such as the X-decoder or Y-decoder is formed on a P-type well region which is independent of the common P-type well region for the memory cells.

In this structure, the N-type semiconductor substrate forms a body gate common to a plurality of P-channel MOSFET's which are formed thereon, and it is set at the level of the power source voltage $V_{cc}$ of the circuitry. A well region as the body gate of an N-channel MOSFET for constructing the CMOS circuit is maintained at the ground potential, 0 V of the circuitry.

Referring to FIG. 13, a memory array M-ARY includes a plurality of memory cells which are arranged in the shape of a matrix. One memory cell is constructed of an MNOS transistor Q2, an addressing MOSFET Q1 which is interposed between the drain of the transistor Q2 and a data line (bit line or digit line) D1, and an isolating MOSFET Q3 which is interposed between the source of the MNOS transistor Q2 and a common source line though this is not especially restrictive. By the way, in a case where the stacked gate structure as stated before is adopted, the channel forming regions of the MOSFET's Q1 and Q3 are directly adjacent to the channel forming region of the MNOS transistor Q2. Therefore, it is to be understood that the drain and source of the MNOS transistor Q2 are terms for convenience sake.

The gates of the respective addressing MOSFET's Q1 etc. of the memory cells arranged in an identical row are connected to the first word line W11 in common, and the gates of the MNOS transistors Q2 etc. corresponding thereto are connected to the second word line W12 in common. Likewise, the gates of the addressing MOSFET's and MNOS transistors of the memory cells arranged in another identical row are respectively connected to the first word line W21 and second word line W22 in common.

The drains of the addressing MOSFET's Q1 etc. of the memory cells arranged in an identical column are connected to the data line D1 in common. Likewise, the drains of the addressing MOSFET's of the memory cells arranged in another identical column are connected to a data line D2 in common. The sources of the isolating MOSFET's Q3 etc. in the memory cells are made common, to construct the common source line CS.

The memory array M-ARY of this embodiment is operated essentially by potentials to be explained below.

First, in a read operation, the potential $V_w$ of the well region WELL is set at a low level which is substantially equal to 0 volt being the ground potential of the circuitry. The common source line CS is set at the low level which is substantially equal to the ground potential. A control line coupled to the gates cf the isolating MOSFET's Q3 is set at a high level which is substantially equal to the power source voltage $V_{cc}$, so as to bring these MOSFET's Q3 into "on" statuses. The second word lines W12-W22 each of which is coupled to the gate electrodes of the corresponding MNOS transistors, are set at a potential substantially equal to the ground potential, that is, a voltage intermediate between the high threshold voltage and low threshold voltage of the MNOS transistors. The first word line to be selected from among the first word lines W11-W21 is brought to a select level or high level which is substantially equal to the power source voltage $V_{cc}$, whereas the remaining first word lines, namely, unselected word lines are held at an unselect level or low level which is substantially equal to the ground potential. The data line to be selected from among the data lines D1-D2 is fed with a sense current. If the MNOS transistor in the memory cell selected by the first word line has the low threshold voltage, this memory cell forms a current path for the data line with which it is coupled. If the MNOS transistor in the selected memory cell has the high threshold voltage, this memory cell forms, in effect, no current path. Accordingly, the data of the memory cell is read out by detecting the sense current.

In a write operation, the well region WELL is set at a minus high voltage which is substantially equal to $-V_{pp}$, and the control line coupled to the gate electrodes of the isolating MOSFET's Q3 is set at a minus high potential so as to bring these MOSFET's Q3 into "off" statuses. The first word lines W11-W21 is set at the unselect level or low level which is substantially equal to the ground potential. One of the second word lines W12-W22 is brought to a select level which is substantially equal to the power source voltage $V_{cc}$, whereas the remaining second word lines are held at a minus high voltage which is close to the voltage $-V_{pp}$. The data lines are set at a high level substantially equal to the power source voltage $V_{cc}$ or a low level having a minus high voltage close to the minus voltage $-V_{pp}$, in accordance with data items to be written into the memory cells.

In an erase operation, the well region WELL and the common source line CS are set at an erase level or high level which is substantially equal to the power source voltage $V_{cc}$. For the purpose of erasure, the first word lines W11-W21 and the second word lines W12-W22 are basically set at the level substantially equal to the power source voltage $V_{cc}$ of the circuitry and the level substantially equal to the voltage $-V_{pp}$, respectively. According to this embodiment, however, the levels of the first and second word lines are determined so as to permit the memory cells to be erased every memory row though this is not especially restrictive. Among the first word lines W11-W21, the first word line corresponding to the memory row which needs to be erased is set at an erase level substantially equal to the power source voltage $V_{cc}$, whereas the first word lines corresponding to the memory rows which need not be erased are set at an unerase level substantially equal to the ground potential of the circuitry. Among the second word lines W12–W22, the second word line corresponding to the first word line which is set at the erase level is brought to an erase level substantially equal to the minus voltage $-V_{pp}$, whereas the second word lines corresponding to the first word lines which are set at the unerase level are held at an unerase level substantially equal to the power source voltage $V_{cc}$.

According to this embodiment, as stated before, there is adopted the construction in which the stored information items of the MNOS transistors are erased by applying the power source voltage $V_{cc}$ to the well region, namely, the body gates of the MNOS transistors. On the other hand, the body gates of the N-channel MOSFET's constituting the CMOS circuits need to be set at a potential of, for example, 0 volt independently of the body gates of the MNOS transistors. As stated before, therefore, the body gates of the memory cells, namely, the semiconductor region WELL formed with the memory array M-ARY are/is electrically isolated from the semiconductor region (well region) in which the N-channel MOSFET's constituting the peripheral circuits such as X-decoder and Y-decoder are formed.

The first and second word lines W11–W21 and W12–W22 are driven by the X-decoder XDCR. Although not especially restricted, the X-decoder XDCR is composed of a plurality of unit decoder circuits which correspond to the memory rows of the memory array M-ARY in one-to-one relationship. As shown by way of example in the figure, one unit decoder circuit is constructed of a NOR gate circuit NOR1 receiving address signals, a gate circuit G and a level conversion circuit LVC.

The gate circuit G is so constructed as to transmit the output of the corresponding NOR gate circuit to the corresponding first word line in, at least, the read operation and to set the first word line at the level substantially equal to the ground potential of the circuitry irrespective of the output of the corresponding NOR gate circuit in the write operation. According to this embodiment, in order to permit the selective erase operation stated before, the gate circuit G is so constructed as to transmit the output of the corresponding NOR gate circuit to the corresponding first word line in the erase operation besides in the read operation.

In the write operation, the level conversion circuit LVC brings the corresponding second word line to the select level substantially equal to the power source voltage $V_{cc}$ in response to the fact that the output of the corresponding NOR gate circuit is the select level of the high level, and it brings the second word line to the unselect level substantially equal to the minus voltage $-V_{pp}$ in response to the fact that the output of the NOR gate circuit is the unselect level of the low level. Besides, in the erase operation, the level conversion circuit LVC brings the corresponding second word line to the erase selection level substantially equal to the minus voltage $-V_{pp}$ in response to the fact that the output of the corresponding NOR gate circuit is the select level of the high level, and it brings the second word line to the erase unselection level substantially equal to the power source voltage $V_{cc}$ in response to the fact that the output of the NOR gate circuit is the unselect level of the low level.

The gates of the isolating MOSFET's Q3 etc. are coupled in common to the control line which is supplied with a control voltage $V_{ig}$ formed by a control voltage generator circuit $V_{ig}$–G. The sources of these isolating MOSFET's Q3 etc. are made common to construct the common source line CS. The control voltage $V_{ig}$ which is supplied to the isolating MOSFET Q3 is set at a low potential of, e.g., about −10 V in order that, in the operation of writing data into the MNOS transistor as will be described later, the MOSFET Q3 may be brought into the "off" status when one of the second word lines W12–W22 with which the memory cell to be selected is coupled is set at the high level (5 V), the well region WELL as the body gate is set at about −12 V and the data line, for example, D1 is set at about −10 V. Thus, even when the data line D2 is set at the high level of, e.g., +5 V, current is prevented from flowing from the data line D2 to the side of the memory cell into which the data is to be written.

The common source line CS is coupled to the output terminal of a common source line driver circuit DVR.

Basically, the driver circuit DVR may have such output characteristics that, in the erase operation, the common source line CS can be driven to the level substantially equal to the power source voltage $V_{cc}$, while in the read operation, the common source line CS can be driven to the level substantially equal to the ground potential of the circuitry. Thus, when the well region WELL is set at the level of the power source voltage $V_{cc}$ in the erase operation, the junction between the well region WELL and the electrode of the MOSFET Q3 coupled to the common source line CS can be prevented from being forward-biased. Moreover, a current path required for the read operation can be formed between the common source line CS and the ground point of the circuitry.

Although not especially restricted, the driver circuit DVR is constructed, as shown in FIG. 13, of a MOSFET Q6 which is interposed between the power source terminal $V_{cc}$ of the circuitry and the common source line CS, MOSFET's Q7 and Q8 which are connected in parallel between the common source line CS and the ground point of the circuitry, and a CMOS inverter circuit IV.

The gates of the MOSFET's Q7 and Q8 are supplied with a control signal er, and the gate of the MOSFET Q6 with a signal obtained by inverting the control signal er by means of the inverter circuit IV. Thus, the MOSFET's Q7, Q8 and the MOSFET Q6 are complementarily turned "on" and "off" in accordance with the level of the control signal er. Basically, the control signal er is set at a high level substantially equal to the power source voltage $V_{cc}$, so as to bring the MOSFET Q6 into the "on" status and the MOSFET's Q7 and Q8 into the "off" statuses in the erase operation, and it is set at a low level substantially equal to 0 volt, in the read and write operations. According to this embodiment, the control signal er has its output timing controlled in correspondence with the change timing of the potential of the well region WELL in order that PN-junctions defined by the MOSFET's etc. formed in the well region may be prevented from falling into forward-biased statuses.

According to this embodiment, MOSFET's Q4 and Q5 are respectively interposed between the second word lines W12 and W22 and the common source line CS. These MOSFET's Q4 and $\overline{Q5}$ are switched and controlled by a control signal $\overline{er/we}$. Although not especially restricted, the control signal $\overline{er/we}$ has its high level set at a level substantially equal to the power source voltage $V_{cc}$ and has its low level set at a level substantially equal to the ground potential. The MOSFET's Q4 and Q5 are made the P-channel type so as to be favorably turned "off" even when the minus potential is applied to the corresponding second word lines W12 and W22. In the read operation, the switching MOSFET's Q4-Q5 are brought into "on" statuses so as to short-circuit the gates of the MNOS transistors Q2 etc. and the common source line CS thereby to equalize the potentials of them. These switching MOSFET's Q4-Q5 are interposed between the corresponding second word lines and the common source line CS, for the following reason:

The MOSFET's Q7 and Q8 in the driver circuit DVR are brought into the "on" statuses in the read operation in accordance with the control signal er which is set at the low level substantially equal to 0 volt. In this case, the MOSFET's Q7 and Q8 have unnegligible "on" resistances though they are connected in parallel as shown in the figure. As a result, the common source line CS has its potential raised by a current which flows through the resistances in the read operation. Especially in a case where the MOSFET's Q7 and Q8 are of the P-channel type, they do not have a driving ability sufficient for changing the common source line CS to the ground potential of the circuitry, and hence, the floating magnitude of the potential of the common source line CS becomes large. More specifically, the current transfer electrodes of the MOSFET's Q7 and Q8 coupled to the common source line CS act as source electrodes with respect to a plus potential which is applied through the memory array M-ARY as well as the common source line CS. Therefore, the MOSFET's Q7 and Q8 are substantially turned "off" when the common source line CS becomes a potential below the threshold voltages of the respective MOSFET's. Such rise in the potential of the common source line CS incurs increase in an effective threshold voltage attributed to the substrate effect of the MNOS transistor, and lowers the conductance of the MNOS transistor which ought to have the low threshold voltage. In other words, a read current which flows through the MNOS transistor having the low threshold voltage is reduced. The short-circuiting MOSFET's Q4 and Q5 render the potentials of the corresponding second word lines W12 and W22 substantially equal to the potential of the common source line CS in the read operation, thereby to prevent the increase of the effective threshold voltage of the MNOS transistor.

The well region WELL in which the memory array M-ARY is formed is supplied with the control voltage $V_w$ which is formed by a control voltage generator circuit $V_w$-G. This voltage $V_w$ is set at a minus high voltage of, e.g., about $-12$ V in the write operation, at a potential of about $+5$ V in the erase operation, and at about 0 V at any other time.

In this embodiment, to the end of raising the speed of the read operation, the respective data lines D1 and D2 of the memory array M-ARY are provided with N-channel MOSFET's Q11 and Q12 which electrically isolate these data lines D1 and D2 from corresponding column switch MOSFET's Q9 and Q10. More specifically, the MOSFET's Q11, Q12 etc. and the N-channel MOSFET's Q9, Q10 etc. as a Y gate (column switch) circuit C-SW are respectively interposed in series form between the corresponding data lines D1, D2 etc. and the common data line CD. The data line isolating MOSFET's Q11-Q12 are formed in the same P-type well region WELL as that of the MNOS transistors. The gates of these MOSFET's Q11-Q12 are supplied with a control voltage $V_c$ which is formed by a control voltage generator circuit $V_c$-G. This control voltage $V_c$ is set at a minus high voltage of, e.g., $-12$ V in only the status of the write operation, and at a high level of, e.g., the power source voltage $V_{cc}$ in the other statuses of the read and erase operations. Thus, the MOSFET's Q11-Q12 are turned "off" in the status of the write operation. Besides, the MOSFET's Q11-Q12 are turned "off" in the status of the erase operation in accordance with the fact that the well region WELL is set at the high level of, e.g., the power source voltage $V_{cc}$. Therefore, the MOSFET's Q11-Q12 are turned "on" only in the status of the read operation. In this manner, the MOSFET's Q11, Q12 etc. are held in the "off" statuses in the write operation, so that even when the potentials of the data lines are brought to the minus high voltage, the nodes between the MOSFET's Q11, Q12 etc. and the column switch MOSFET's Q9, Q10 etc. to be explained below are held in floating statuses. Thus, the sources and drains of the switch MOSFET's Q9, Q10 etc. coupled to the mutual nodes and the well region in which these MOSFET's are formed can be prevented from being forward-biased.

The gates of the MOSFET's Q9-Q10 constituting the column switch circuit C-SW are supplied with the output signals of a Y-decoder YDCR. In the read operation, the outputs of the Y-decoder YDCR are set at a select level substantially equal to the power source voltage $V_{cc}$ or at an unselect level substantially equal to 0 volt.

The common data line CD is coupled to the output terminal of a data input circuit DIB which constitutes an input/output circuit IOB, and to the input terminal of a data output circuit DOB which is composed of a sense amplifier SA and an output buffer circuit OBC. The input terminal of the data input circuit and the output terminal of the data output circuit constituting the input/output circuit IOB are coupled to an external terminal I/0.

According to this embodiment, each of the data lines D1-D2 is provided with a latch circuit FF which serves to hold preceding stored information before an erase/write mode, and with a level conversion circuit LVC which brings the potential of the data line to the minus high voltage $-V_{pp}$ selectively according to the stored information of the latch circuit FF in the write operation. These circuits realize an automatic rewrite operation to be explained later, and the simultaneous writing of data items into a plurality of memory cells coupled to one selected word line.

Figure 14:
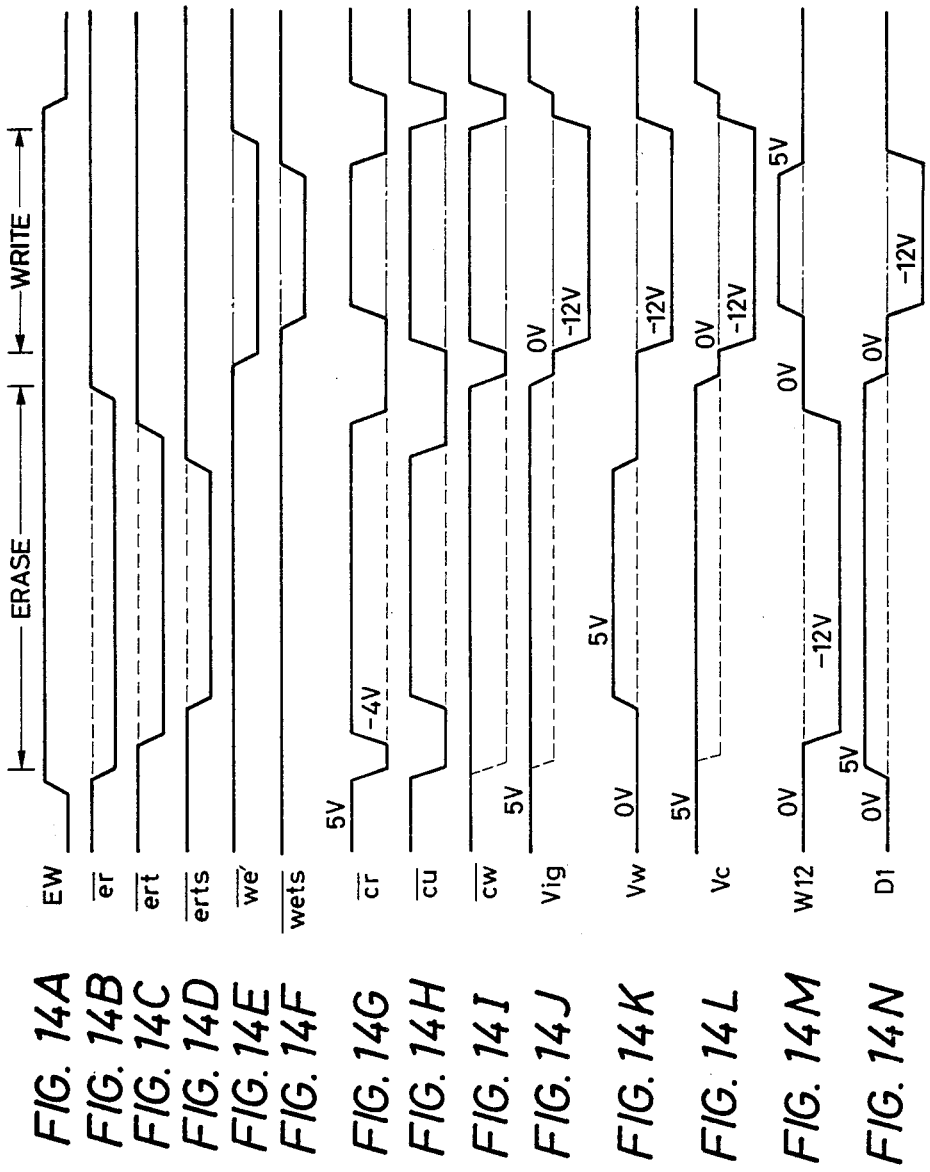
FIGS. 14A thru 14N are diagrams of the operating waveforms of the fourth embodiment.

The control circuit CONT receives the chip enable signal, write enable signal and output enable signal respectively supplied to the external terminals $\overline{CE}$, $\overline{WE}$ and $\overline{OE}$ and the write voltage supplied to the external terminal $-V_{pp}$ as stated before. Thus, it discriminates various operation modes and produces various control signals for controlling the operations of the circuits such as the gate circuits G, level conversion circuits LVC, control voltage generator circuits $V_{ig}$-G, $V_c$-G and $V_w$-G, driver circuit DVR, data input circuit DIB and data output circuit DOB. Among the control signals which are formed by the control circuit CONT, principal ones are illustrated in FIG. 13. In addition, the waveform diagrams of the principal control signals are exemplified in FIG. 14A-FIG. 14N.

Although not especially restricted, a read operation mode is instructed by the low level, low level and high level of the respective signals (hereinbelow, expressed as signals $\overline{CE}$, $\overline{WE}$ and $\overline{OE}$) at the external terminals $\overline{CE}$, $\overline{WE}$ and $\overline{OE}$, and a standby operation mode is instructed by the high level of the signal $\overline{CE}$. The first write operation mode for writing data items into the latch circuits FF in FIG. 13 is instructed by the low level, low level, high level and low level of the respective signals $\overline{CE}$, $\overline{WE}$, $\overline{OE}$ and $-V_{pp}$, while the second write operation mode for writing data items into the memory cells is instructed by the low level, low level, high level and high level of the respective signals $\overline{CE}$, $\overline{WE}$, $\overline{OE}$ and $-V_{pp}$. An erase operation is instructed for a predetermined interval when the second write operation mode has been instructed.

The various control signals to be delivered from the control circuit CONT are provided in time series in accordance with this embodiment. The oscillator circuit OSC in FIG. 13 is operated by the power source voltage $V_{cc}$ of, e.g., +5 volts which is applied between the external terminals $V_{cc}$ and GND of the EEPROM device. If necessary for lowering the power consumption of the circuitry, it is also allowed to control the oscillator circuit OSC so as to operate only when the write voltage is applied to the terminal $-V_{pp}$ by way of example.

Now, an example of the second write operation mode of the EEPROM of this embodiment will be described with reference to the timing charts shown in FIG. 14A -FIG. 14N.

In case of rewriting data, the first write mode not illustrated is carried out before the second write mode. In the first write mode, the stored information items of all the memory cells coupled to one addressed word line are once fetched and are held in the latch circuits FF shown in FIG. 13. Subsequently, a data signal supplied from the external terminal is put into the latch circuit corresponding to the data line of the memory cell into which the data item is to be written. By way of example, in a case where all the bits of the memory cells coupled to the word line are to be rewritten, the Y-addresses are sequentially switched, whereby the write signals composed of a plurality of bits and supplied from the external terminal are sequentially put into the respectively corresponding latch circuits.

Thereafter, the second write mode illustrated in the charts is carried out. The erase operations of the MNOS transistors coupled to the word line are performed, whereupon the memory cells for one word line are simultaneously subjected to write operations in accordance with the information items of the latch circuits. Owing to the above operations, a write operation which is similar to that of a static RAM when viewed from outside can be executed.

In the second write mode which is instructed by the low level, low level, high level and high level of the respective external signals $\overline{CE}$, $\overline{WE}$, $\overline{OE}$ and $-V_{pp}$ not shown, a control signal EW is raised from a low level to a high level. Internal signals $\overline{er}$, $\overline{ert}$ and $\overline{erts}$ are respectively changed from high levels to low levels with predetermined time differences since the rise of the signal EW to the high level. The MOSFET Q6 of the driver circuit DVR in FIG. 13 is brought into the "on" status by the low level of the internal signal $\overline{er}$ (high level of er), so that the common source line CS of the memory array M-ARY is set at the high level of, e.g., +5 V. Owing to the time difference between the internal signals $\overline{er}$ and $\overline{ert}$, a reset signal $\overline{cr}$ is changed from +5 V to a low level of, e.g., $-4$ V at which it is temporarily held. Thus, the output terminals of the level conversion circuits LVC (the word lines W12 etc.) are reset to the ground potential and are thereafter set at the low level (0 V) in the floating statuses. Besides, owing to the time difference between the internal signals $\overline{er}$ and $\overline{erts}$, a reset signal $\overline{cu}$ is changed from +5 V to a low level of, e.g., $-4$ V at which it is temporarily held. Thus, loads having comparatively large parasitic capacitances, such as the well WELL and isolating MOSFET's, are subjected to reset operations similar to the above.

In response to the low level of the internal signal $\overline{ert}$, the X-decoder XDCR starts the level changing operation thereof. By way of example, the potential of the selected second word line, in other words, the gate potentials of the MNOS transistors to be erased is/are lowered to the minus high voltage of about $-10$ V as explained before. The potentials of the word lines not to be selected, in other words, the gate voltages of the MNOS transistors to be inhibited from the erase operations are set at the high level of, e.g., +5 V as understood from the above-stated operations though this situation is not illustrated.

Thereafter, the control voltage generator circuit $V_w$-G for forming the drive voltage of the body gate of the memory array M-ARY, in other words, the well region WELL sets its voltage $V_w$ at the high level of, e.g., +5 V in response to the low level of the internal signal $\overline{erts}$.

Thus, the minus high voltage is supplied between the body gate and the gates of the MNOS transistors coupled to the selected word line. As a result, information charges gathered in the floating gates of the MNOS transistors are restored into the body gate by the tunnel effect based on the high electric field. Incidentally, since the body gate and the gates of the MNOS transistors coupled to the unselected word lines are held at the identical potential, the erase operations of these MNOS transistors are not performed.

In ending the erasure, the internal signals are respectively changed from the low levels to the high levels with time differences in the order of $\overline{erts}$, $\overline{ert}$ and $\overline{er}$ reverse to the order for the start of the erasure. Consequently, the original statuses are restored in the order of the well region WELL, the second word line and the data lines. In addition, reset signals $\overline{cr}$, $\overline{cu}$ and $\overline{cw}$ are formed by the aforementioned internal signals. With the above operation timings, in starting the erasure, the potential of the P-type well region WELL is lastly raised to the high level of, e.g., the power source voltage $V_{cc}$, and in ending the erasure, it is first lowered. Therefore, the PN-junctions between the well region WELL and the N-type drains and sources of the addressing MOSFET's or isolating MOSFET's formed in this well region WELL can be maintained in reverse-biased statuses.

The above erase operation is followed by the write operation.

Internal signals $\overline{we}$ and $\overline{wets}$ are successively changed from high levels to low levels with a time difference.

In response to the low level of the internal signal $\overline{we}$, the control voltage generator circuit $V_w$-G brings its voltage $V_w$ to the minus high voltage $-V_{pp}$ of, e.g., $-12$ V. Thus, the well region WELL formed with the memory array M-ARY is first lowered to the minus high voltage $-V_{pp}$. In synchronism therewith, also the control voltage generator circuit $V_{ig}$-G brings its voltage $V_{ig}$ to the minus high voltage of, e.g., about $-12$ V.

Thus, the isolating MOSFET's of the memory cells are turned "off." Likewise, the voltage $V_c$ is brought to the minus high voltage of, e.g., $-12$ V as stated above. Thus, the data line isolating switch MOSFET's Q11–Q12 are turned "off." Moreover, the gate circuits G of the X-decoder XDCR are enabled in accordance with the low level of the internal signal $\overline{we'}$, whereby the first word line of the selected memory cells is set at the high level ($+5$ V), and the unselected word lines are set at the ground potential (0 V) of the circuitry (not illustrated).

Subsequently, in synchronism with the low level of the internal signal $\overline{wets}$, the X-decoder XDCR brings the selected second word line to the high level ($+5$ V) and the unselected ones to the low level. Upon receiving the high level and low level, the level conversion circuits LVC bring the corresponding second word line to the high level of, e.g., $+5$ V for the select signal of the high level and the corresponding second word lines to the minus high voltage of, e.g., $-10$ V for the unselect signals of the low level though the latter case is not illustrated. In addition, the level conversion circuits LVC coupled to the respective data lines are brought into operating statuses. Then, according to the stored information items of the corresponding latch circuits FF, by way of example, the level conversion circuit to write logic "1" is set at the minus high voltage of about $-10$ V, and the level conversion circuit to write logic "0" (to be inhibited from writing) is set at the high level of about $+5$ V. Accordingly, regarding the MNOS transistor into which the logic "1" is to be written, the gate voltage becomes about $+5$ V, the voltage of the body gate (well region WELL) becomes about $-12$ V, and the drain (data line) voltage becomes about $-10$ V, so that a high electric field of, e.g., about 15 V acts between the channel in the body gate and the gate electrode, and electrons are injected by the tunnel effect. In contrast, regarding the MNOS transistor into which the logic "0" is to be written, the drain voltage is brought to about $+5$ V, so that no high voltage is applied between the gate and the channel, and the injection of electrons does not take place.

In ending the write operation, the internal signals are respectively changed from the low levels to the high levels with a time difference in the order of $\overline{wets}$ and $\overline{we'}$ reverse to the order for the start of the write operation. Consequently, the original statuses are restored in the order of the data lines as well as the second word lines and the well region. In addition, the reset signals $\overline{cr}$, $\overline{cu}$ and $\overline{cw}$ are formed by the aforementioned internal signals. With the above operation timings, in starting the writing, the potential of the P-type well region WELL is first lowered to the minus high voltage, and in ending the writing, it is lastly restored. Therefore, the PN-junctions between the well region WELL and the N-type drains and sources of the addressing MOSFET's or isolating MOSFET's formed in this well region WELL can be maintained in the reverse-biased statuses.

In this embodiment, as illustrated in FIG. 12, the control circuit CONT inhibits the memory block MB1 from the erase operation by the use of the signal formed by the decoder DEC, irrespective of the erase inhibit signal EI. That is, even when the memory block MB1 is addressed and is instructed to rewrite data, the erase operation is inhibited, so that only the write operation is performed. In other words, the various control signals for the erase operation shown in FIGS. 14A–14N are not generated, so that only the write operation is validated and executed. More specifically, in response to the erase inhibit signal EI' rendered the high level, the control circuit CONT forms various signals indicated by broken lines in an erase period shown in FIGS. 14A–14N. On the other hand, the control circuit CONT forms signals indicated by solid lines in a write period. Thus, the erase operation is inhibited, and only the write operation is executed. In this way, only the first write operation is, in effect, validated for the memory block MB1. Accordingly, data to be protected (for example, a normal identifying code or ID information) is permitted to be effectively written at first. After such identifying code or ID information has been written, the erasure is inhibited, with the result that merely a change from the logic "1" (unwritten status) to the logic "0" (written status) is executed by the write operation. Thus, even when it is intended by an unlawful manipulation to rewrite the data of the memory block MB1 into any identifying code or ID information, only the write operation proceeds, with the result that merely the bits corresponding to the logic "1" are changed to the logic "0," with the bits of the logic "0" remaining unchanged. Therefore, merely the number of bits of the logic "0" within one data increases, and the stored data is, in effect, changed to a meaningless identifying code or ID information.

With note taken of this fact, it becomes possible to discriminate whether or not data has been illicitly written. It is assumed by way of example that the identifying code or ID information be unit data composed of 8 bits. Although not especially restricted, the number of the bits of the logic "0" is determined to be four in the unit data. Then, when the unlawful rewriting as exemplified above has been done, the logic "1" in the remaining 4 bits is changed to the logic "0," and the number of bits of the logic "0" exceeds 4. Thus, when the identifying code or ID information etc. are read out, whether or not the unlawful rewrite operation has been done can be simply decided by counting the number of the bits of the logic "0." When the number of bits of the logic "0" is limited to 4 in the unit data, codes expressive of characters or numerals which can be constructed of signals of 8 bits are in a number of 70 which is small as compared with the number of 256 in the case of employing all of the 8 bits. The 70 sorts, however, suffice for the characters or numerical values. The smaller number of sorts can also be solved in such a way that the memory capacity of the memory block MB1 is enlarged to increase the digits of the characters or numerical values of the identifying code or ID information. Alternatively to setting the number of "0's" for the unit data, one identifying code or ID information is constructed of a plurality cf data items, for example, 8 bytes, in which the summation of "0's" may be set at a number of 32.

By endowing the stored contents with a redundancy, errors in which the logic "1" is read out as the logic "0" due to malfunctions based on noise or the like can also be remedied by software or hardware.

For testing the write operation and erase operation for the memory block MB1, it is desirable to add the function of validating the erase operation of the memory block MB1 in only the overall erase operation. To this end, the control circuit CONT is additionally provided with the function of instructing the overall erasure and the function of responsively invalidating the erase inhibit signal EI' delivered from the gate circuit G1.

Besides, the control circuit CONT is supplied with the write inhibit signal WI. In response to the write inhibit signal WI rendered the high level, the control circuit CONT forms various signals indicated by dot-and-dash lines in the write period shown in FIGS. 14A–14N. Thus, the operation of writing data into the EEPROM is inhibited. That is, the erase operation is possible, but the write operation becomes impossible.

Of course, in a case where the inhibit signals EI' and WI are respectively held at the high levels, neither the erase operation nor the write operation can be executed for the memory block MB1, and the EEPROM can be regarded as a kind of masked ROM.

Figure 15:
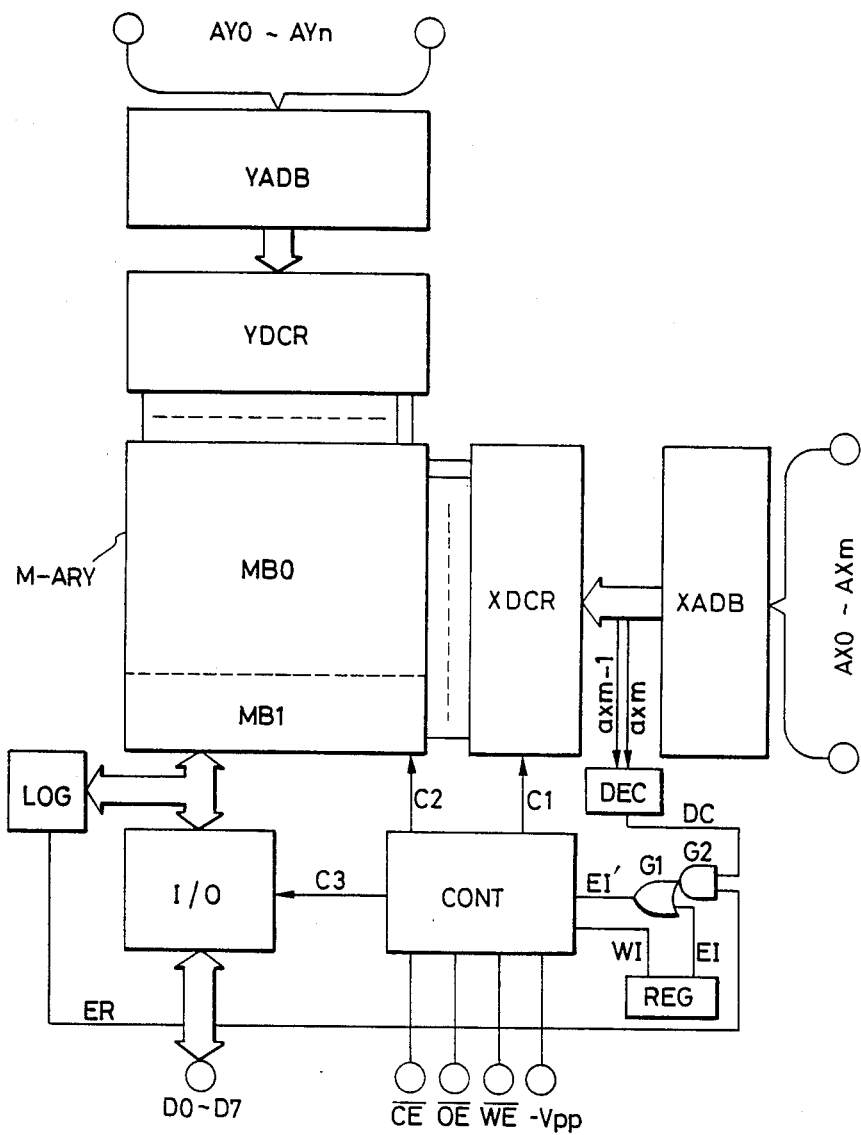
FIG. 15 is a block diagram showing the fifth embodiment of the present invention.

Shown in FIG. 15 is a block diagram of an EEPROM device which is the fifth embodiment of this invention.

In the embodiment of FIG. 12, the memory block MB1 is inhibited from erasure, and hence, the write/erase operation tests of the memory block MB1 are inconvenient. According to this embodiment, therefore, the EEPROM in FIG. 12 is further furnished with circuits to be explained below:

A decision circuit LOG is disposed which receives the signal of the internal signal line (common data line) between the memory array M-ARY and the input/output circuit I/O. This decision circuit LOG has the function of counting the number of "0's" in unit data read out of the memory array M-ARY. By way of example, the number of "0's" in the unit data written in the memory block MB1 is set at 4 as described before. Then, the decision circuit LOG forms a decision signal ER which is set at a high level (logic "1") when the number of "0's" in the read data is at least 4, and which is set at a low level (logic "0") when the number of "0's" is less than 4. This decision signal ER is supplied to one input of an AND gate circuit G2, the other input of which is fed with the output signal of the decoder DEC, as the control signal of the gate circuit G2. The output signal of the AND gate circuit G2 is supplied to one input of the OR gate circuit G1, the other input of which receives the erase inhibit signal EI from the register REG.

In this arrangement, when the address of the memory block MB1 to be rewritten is designated by addressing, reading the address is automatically instructed. If the number of "0's" of data thus read out is less than 4, the decision circuit LOG brings the output signal ER to the low level. Thus, even when the decoder DEC has formed the signal detecting the access to the memory block MB1, the erase inhibition by this decoder DEC can be invalidated. Accordingly, the write test or erase test for the memory block MB1 can be conducted at will in such a way that the number of "0's" in data to be written is set to be less than 4. After the end of such tests, when data to be protected is written, the number of "0's" in unit data may be set at 4 as explained before. Let's consider a case where the memory block MB1 is addressed to instruct rewriting after an identifying code, ID information or the like composed of a plurality of data items each including the four logical "0's" as stated above has been written. In this case, an internal read operation is performed beforehand, and the output signal ER of the decision circuit lOG is set at the high level (logic "1") because the number of logical "0's" is 4. Therefore, the output signal of the decoder DEC is validated to inhibit the erase operation as in the foregoing. Data read out by the internal read operation is not delivered to the external terminals D0–D7 at all for the reason that the input/output circuit I/O is put in a non-operating status.

According to this embodiment, the addition of the decision circuit LOG and gate circuit G2 of comparatively simple arrangement makes it possible to easily perform the rewrite test of the memory block MB1 which is inhibited from the erase operation. Besides, the decision circuit can be endowed with the function of informing the exterior of the fact that data has been illicitly written. More specifically, the function of detecting that the set number of logical "0's" (4 in the above example) is exceeded is added as a count deciding function, and an alarm signal indicative of the illicit writing is generated.

The circuit blocks and the internal circuits and operations thereof omitted from the above description are similar to those elucidated with reference to FIG. 12—FIG. 14N.

Figure 16:
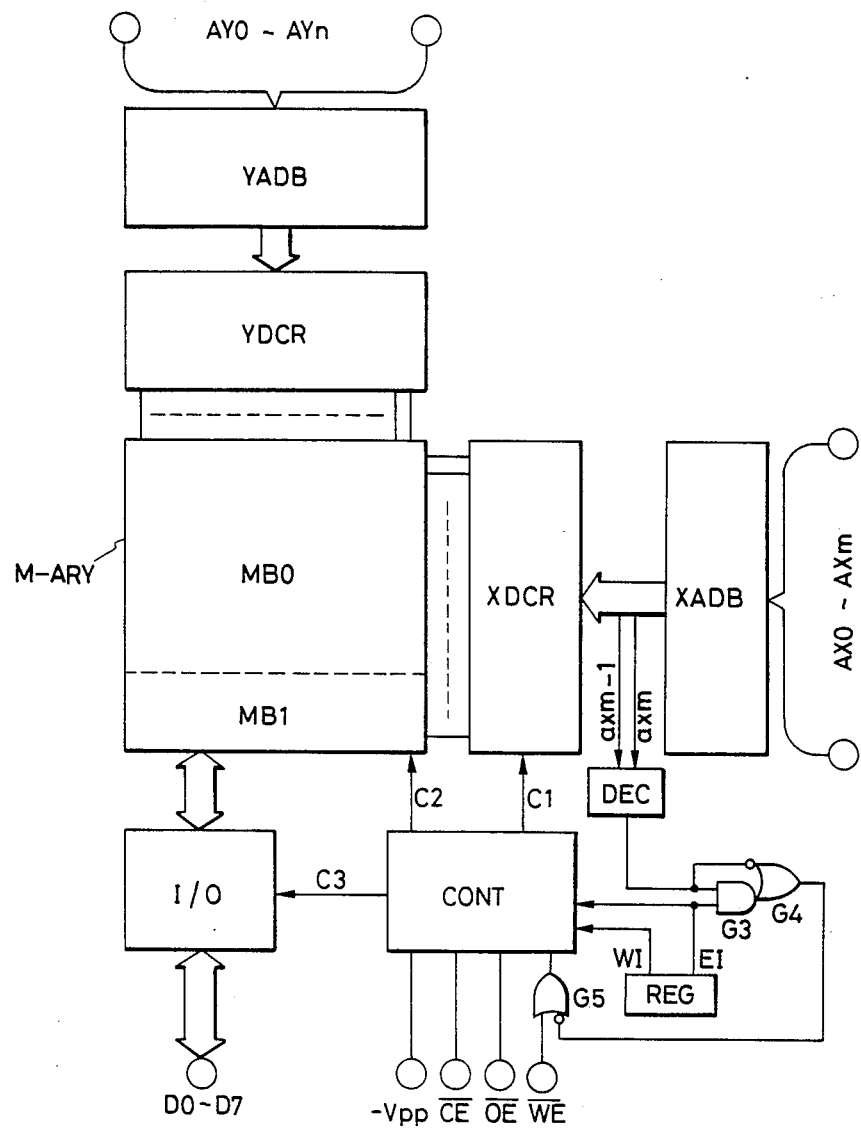
FIG. 16 is a block diagram showing the sixth embodiment of the present invention.

Shown in FIG. 16 is a block diagram of an EEPROM device which is the sixth embodiment of this invention. In this embodiment, the write operation is also inhibited by invalidating the input itself of the control signal $\overline{WE}$ instructive of the write operation, in place of the arrangement of the EEPROM in FIG. 12 or FIG. 15 in which the erase inhibit signal EI' is, in effect, generated when the memory access to the memory block MB1 has been detected by the decoder DEC.

More specifically, an output signal formed by the decoder DEC for decoding the addressing to the memory block MB1 is supplied to one input of an AND gate circuit G3, while the inverted signal thereof is supplied to one input of an OR gate circuit G4. The other input of the AND gate circuit G3 is fed with the erase inhibit signal EI of the register REG. The erase inhibit signal EI is also supplied to the control circuit CONT. In addition, the output signal of the AND gate circuit G3 is supplied to the other input of the OR gate circuit G4. The output signal of the OR gate circuit G4 as inverted is transmitted to one input of an OR gate circuit G5. The other input of the OR gate circuit G5 is fed with the write enable signal $\overline{WE}$ from an external terminal. Thus, the OR gate circuit G5 operates, in effect, to limit the input of the write enable signal $\overline{WE}$ supplied from the external terminal, in accordance with the output signal of the OR gate circuit G4.

By way of example, when the memory block MB1 is addressed in the state in which the erase inhibit signal EI of the register REG is at the high level (set status) instructive of the impossibility of erasure, the output signal of the AND gate circuit G3 becomes a high level, which enables the OR gate circuit G5 through the OR gate circuit G4. Thus, the input of the write enable signal $\overline{WE}$ is granted. Then, it is permitted to write data into the memory block MB1. Since, however, the erase operation of the memory block MB1 is inhibited by the high level of the erase inhibit signal EI, rewriting data is impossible.

Further, when the memory block MB1 is addressed in the state in which the erase inhibit signal EI of the register REG is at the low level (clear status), the output signal of the OR gate circuit G4 becomes a low level. Thus, the OR gate circuit G5 invalidates the input of the write enable signal $\overline{WE}$ supplied from the external terminal and inhibits the instruction of the write operation. Then, the write operation for the memory block MB1 can also be inhibited. Bringing the erase inhibit signal EI of the register REG into the clear status is required for permitting erasure for the rewriting of the memory block MB0. In this manner, the rewriting of the memory block MB0 can be done while the writing of data into the memory block MB1 is inhibited. Moreover, in this embodiment, the procedure for writing data into the memory block MB1 is such that, as stated above, the write enable signal $\overline{WE}$ must be afforded after setting the erase inhibit signal EI. Therefore, the probability of erroneous writing can be lowered.

The circuit blocks and the internal circuits and operations thereof omitted from the above description are similar to those elucidated with reference to FIG. 12--FIG. 14N.

Figure 17:
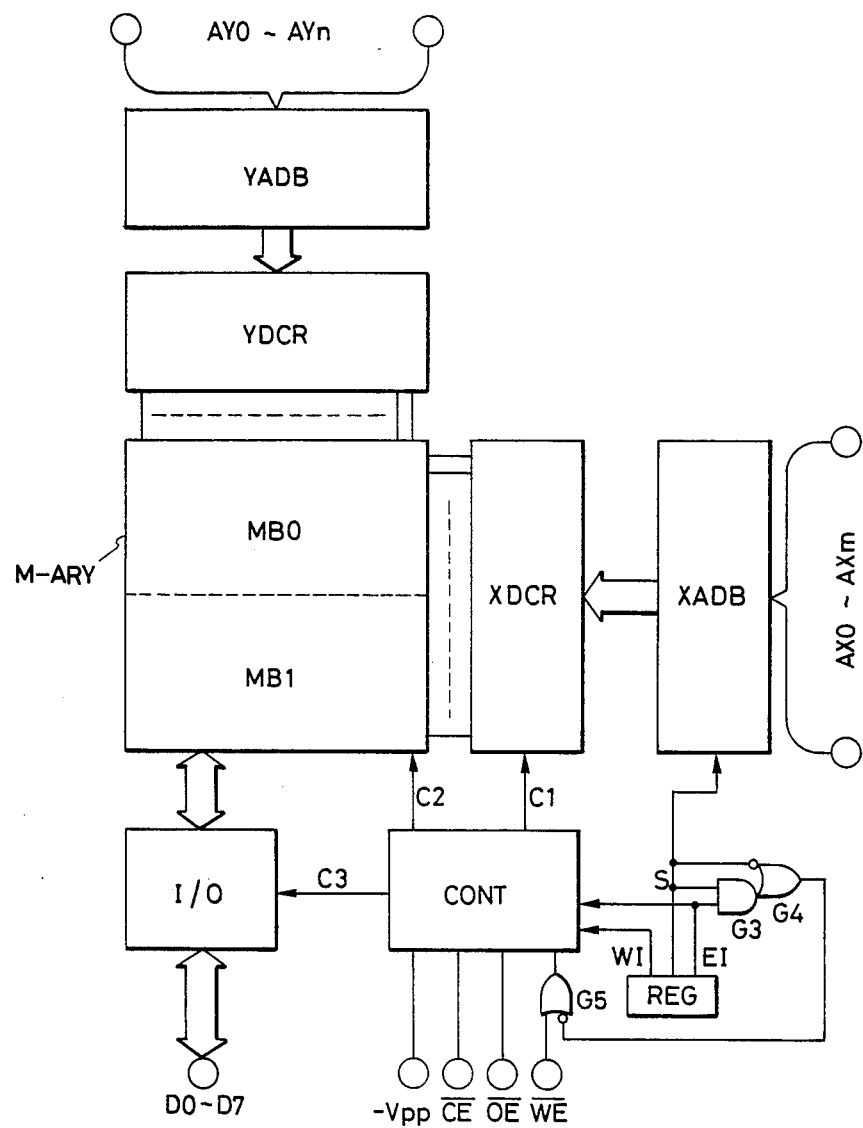
FIG. 17 is a block diagram showing the seventh embodiment of the present invention.

Shown in FIG. 17 is a circuit diagram of an EEPROM device which is the seventh embodiment of this invention.

In this embodiment, the storage area of the memory array M-ARY is equally divided in two in the direction of word lines though not especially restricted. In a case where the number of bits of the address signals AX-0–AXm to be supplied from external terminals is equal to that in the embodiment of FIG. 12, FIG. 15 or FIG. 16, the storage capacity of the memory array M-ARY becomes double that in the preceding embodiment. To the contrary, in a case where the memory array M-ARY in FIG. 17 has a storage capacity equal to that of the memory array M-ARY in FIG. 12, FIG. 15 or FIG. 16, the number of bits of the address signals AX-0–AXm to be supplied from the external terminals is reduced by one.

Thus, in addressing the memory array from the external terminals, only either of the memory blocks MB0 and MB1 each having a storage capacity equal to half of that of the memory array M-ARY can be designated. In order to select the memory block MB0 or MB1, a select bit S is internally generated in this embodiment. It is to be understood that the select bit S is regarded as an X-address signal of the most significant bit for the memory array M-ARY. Therefore, the select bit S is transmitted to the X-decoder XDCR through the X-address buffer XADB. This select bit S is generated by the register REG. In other words, the register REG in this embodiment holds the select bit S besides the same write inhibit signal WI and erase inhibit signal EI as in the foregoing. By providing such a select bit S, the decoder DEC is dispensed with.

Although not especially restricted, the select bit S can be substituted for the output signal of the decoder DEC shown in FIG. 16. That is, the select bit S is supplied, not only to the X-address buffer XADB, but also to one input of the same AND gate circuit G3 as in the embodiment of FIG. 16, while the inverted signal of the select bit S is supplied to one input of the same OR gate circuit G4. The other input of the AND gate circuit G3 is fed with the erase inhibit signal EI of the register REG. The erase inhibit signal EI is also supplied to the control circuit CONT. In addition, the output signal of the AND gate circuit G3 is supplied to the other input of the OR gate circuit G4. The output signal of the OR gate circuit G4 as inverted is transmitted to one input of the OR gate circuit G5. The other input of this OR gate circuit G5 is fed with the write enable signal $\overline{WE}$ applied from the external terminal. Thus, the OR gate circuit G5 operates, in effect, to limit the input of the write enable signal $\overline{WE}$ supplied from the external terminal, in accordance with the output signal of the OR gate circuit G4.

By way of example, when the select bit S is brought into a set status (high level) to instruct a select operation for the memory block MB1 in the state in which the erase inhibit signal EI of the register REG is at the high level (set status) instructive of the impossibility of erasure, the output signal of the AND gate circuit G3 becomes the high level, which enables the OR gate circuit G5 through the OR gate circuit G4. Thus, the input of the write enable signal $\overline{WE}$ is granted. Then, it is permitted to write data into the memory block MB1. Since, however, the erase operation of the memory block MB1 is inhibited by the high level of the erase inhibit signal EI, rewriting data is impossible.

Besides, when a select operation for the memory block MB1 is instructed by bringing the select bit S into the set status in the state in which the erase inhibit signal EI of the register REG is at the low level (clear status), the output signal of the OR gate circuit G4 becomes the low level. Thus, the OR gate circuit G5 invalidates the input of the write enable signal $\overline{WE}$ supplied from the external terminal and inhibits the instruction of the write operation. Then, the write operation for the memory block MB1 can also be inhibited.

Meanwhile, when the select bit S is cleared (set at a low level), a select operation for the memory block MB0 is instructed. Thus, the output signal of the OR gate circuit G4 becomes the high level irrespective of the erase inhibit signal EI, and the input of the write enable signal $\overline{WE}$ is validated. Herein, if the erase inhibit signal EI of the register REG is in the set status, an erase operation for the memory block MB0 is inhibited, and only writing is permitted, and if the erase inhibit signal EI is in the clear status, a rewrite operation is permitted. Such writing and rewriting for the memory block MB0 are premised on the clear status of the write inhibit signal WI.

In this manner, the rewriting of the memory block MB0 can be done while the writing of data into the memory block MB1 is inhibited. Moreover, in this embodiment, the procedure for writing data into the memory block MB1 is such that, as stated above, the setting of the select bit S is needed besides the setting of the erase inhibit signal EI. Therefore, the writing procedure becomes complicated, and the protection can be strengthened. In this case, the writing procedure can be made more complicated by an arrangement in which the select bit S and the erase inhibit signal EI cannot be simultaneously set, for example, by assigning separate addresses.

Besides, the storage area of the memory array M-ARY may well be divided in two in the direction of data lines. In this case, the data items of an identical address are read out of the respective memory blocks MB0 and MB1. The content of the memory block MB1 read out is used as data for determining whether or not erasure, writing or reading for the memory block MB0 is granted. Thus, such a control as granting the addressing to the memory block MB0 or granting the operation of the output circuit of the input/output circuit I/O is conducted according to the data read out of the memory block MB1. In this way, secret data held in the memory block MB0 can be inhibited from being rewritten or being delivered outside the EEPROM. In this case, the decision circuit LOG can be utilized for making it possible to read out the normal secret data, in other words, for making it possible to rewrite data written in the memory block MB1, into data for granting the readout of data from the memory block MB0. That is, the number of the logical "0"s of a signal inhibiting the reading may be set smaller than a fixed number beforehand, and the rewriting of the data of the memory block MB1 may be granted as long as data is illicitly written.

The above arrangement in which, owing to the division of the memory array M-ARY in two, the alternative addressing to the memory blocks MB0 and MB1 is permitted by the select bit S, may well be replaced with an arrangement in which the select bit S is input to the decoder, thereby to validate/ invalidate a select operation for any desired memory area. Even in this case, the select bit S can be regarded as a part of substantial address information, and hence, operations similar to the foregoing can be performed.

The circuit blocks and the internal circuits and operations thereof omitted from the above description are similar to those of the fourth embodiment.

While the fourth-seventh embodiments exemplify the applications of the present invention to the EEPROM's, the single-chip microcomputer can be endowed with the function of data protection as in the third embodiment stated before in such a way that the EEPROM in which the present invention is performed is built in the microcomputer. This purpose can be readily realized by employing any of the EEPROM's of the fourth-seventh embodiments instead of the EEPROM 86 in FIG. 11.

Functional effects which are produced by the foregoing embodiments are as stated below:

(1) In case of overall and simultaneous erasure, some of stored data items are conserved, so that the prevention of an illicit use and the shortening of a testing time can be made compatible.

(2) A method for the conservation is so constructed that some of stored data items are transferred and held outside a group of non-volatile memory cells before the overall and simultaneous erasure, and that the stored data items are written again after the overall and simultaneous erasure, whereby the invention becomes applicable also to an overall erasure type non-volatile memory.

(3) Stored data to be held outside the group of non-volatile memory cells is endowed with protective information, thereby making it possible to select whether or not the conservation is performed.

(4) On the basis of the protective information, erasure is withheld in row address unit, whereby the addresses and capacity of stored data to be conserved can be set at will in row address unit.

(5) In case of simultaneous erasure, the row addresses to be withheld from the erasure are fixed, whereby some stored data items stated above can be transferred outside the group of non-volatile memory cells, and a simpler construction is realized.

(6) A memory area in a non-volatile memory circuit which is electrically writable and erasable is divided, and the function of inhibiting a write or erase operation for the whole or partial memory area is added, thereby to attain the effect that the unlawful rewriting of data can be made impossible.

(7) Addressing to a memory area in which data to be protected is stored is detected, and an erase operation is inhibited according to the detection, thus to adopt a construction in which while the data to be protected is permitted to be written, it is destroyed by multiple writing thereon, thereby to attain the effect that the data can be substantially protected.

(8) By adding a simple circuit for detecting addressing to a memory area in which data to be protected is stored, there is attained the effect that the protection of the data can be realized.

(9) By adopting a construction in which the number of bits in a written status is previously set for data to-be-protected, there is attained the effect that whether or not data has been unlawfully written can be decided.

(10) By adopting a construction in which the number of bits indicative of a written status in readout data is decided, and an erase operation is granted when the number of the written bits is not larger than a fixed number, there is attained the effect that write, erase and rewrite tests for a memory area in which data to be protected is stored can be simply conducted while the protection of the data is achieved.

(11) Owing to the combination between an erase inhibit signal and addressing to a memory area in which data to be protected is stored, there is attained the effect that while writing for the memory area is inhibited with the first writing of the data to-be-protected made possible, rewriting for another memory area can be made possible.

(12) A select bit is internally provided so as to select memory blocks in accordance with this select bit, and the erase operation of the memory block selected in correspondence with the set status of the select bit is inhibited, thus to adopt a construction in which while data to be protected is permitted to be written, it is destroyed by multiple writing thereon, thereby to attain the effect that the data can be substantially protected.

(13) By providing a select bit, a decoder for addressing is dispensed with, and hence, there is attained the effect that the protection of the data as stated above is realized by a simpler circuit arrangement.

(14) By adopting a construction in which two memory blocks having an identical address assigned thereto by the designation of a select bit are alternatively brought into selected statuses, it becomes possible that when the writing or reading of data into or from one memory block has been instructed, the data of the other memory block at the identical address is previously or simultaneously read out to decide whether the instructed operation is granted or inhibited. Thus, there is attained the effect that protection is permitted in the unit of the data.

Although, in the above, the invention made by the inventor has been concretely described in conjunction with embodiments, it is needless to say that the present invention is not restricted to the foregoing embodiments, but that it can be variously altered within a scope not departing from the purport thereof. By way of example, an EEPROM may well be such that an erase operation and a write operation are independently designated and that a memory array is erased or written according to the designated operation. Besides, the first write operation mode may well be shifted to the second write operation mode automatically within an EEPROM. Alternatively, overall erasure may be carried out every memory block by dividedly isolating a well region in which a memory array is constructed. Further, the capacity of a memory block in which data to be protected is stored may well be made freely designated by a master slice system. In, for example, the embodiment of FIG. 12, the memory area of the memory block MB1 can be simply changed by altering the address signals which are supplied to the decoder. Alternatively to the system based on the division of word lines, the system for dividing memory blocks may be based on the division of data lines or based on the combination of the divisions of the word and data lines.

Adopting the division of the data lines in this manner can be realized by, for example, disposing a decoder which receives address signals from a Y-address buffer or supplying a select bit to a Y-address buffer or a decoder.

Further, the practicable arrangements of a memory array and its peripheral circuits can adopt various modifications. By way of example, although the high voltage $-V_{pp}$ has been described as being supplied from outside, a high voltage generator circuit may well be built in. Alternatively to the peripheral circuits constructed of the CMOS circuits as stated before, they may be constructed of only N-channel MOSFET's or P-channel MOSFET's. Further, as high voltages for writing/erasing, various aspects of performance can be adopted, including a method in which a substrate formed with MNOS transistors is fixed at the ground potential of circuitry, whereupon a plus high voltage and a minus high voltage are used. An EEPROM according to this invention is constructed as a single non-volatile memory as in any of the embodiments, and besides, it can be comparatively simply built in a digital integrated circuit, for example, a microcomputer of single chip because a circuit scale for realizing the data protective function as stated above is small. The single-chip microcomputer which has the built-in EEPROM endowed with the protective function as stated above is suitable for an IC card. More specifically, the IC card needs to have its physical strength increased for the purpose of protecting a built-in semiconductor integrated circuit device. If the single-chip microcomputer having the built-in EEPROM as described above can be realized, the physical size of the semiconductor integrated circuit device built in the IC card can be made small, so that the increase of the physical strength is simplified and that the cost of the IC card can be lowered.

A non-volatile memory element which is electrically writable and erasable may be any other than the MNOS transistor, such as an element of FLOTOX (floating-gate tunnel oxide) structure.

This invention can be extensively utilized for semiconductor integrated circuit devices each including a non-volatile memory circuit which is electrically writable and erasable.

What is claimed is:

1. A non-volatile memory comprising:
   a group of non-volatile memory cells having a predetermined memory cell rank containing protective information comprising control data indicative of a select set of the non-volatile memory cells not to be erased during an erasure mode;
   a means for electrically writing and erasing data into and from said group of non-volatile memory cells including means for withholding erasure of the select set of non-volatile memory cells not to be erased, while erasing non-indicated memory cells; and,
   volatile storage means for storing the protective information prior to the erasure mode.

2. The non-volatile memory according to claim 1, wherein said volatile storage means further comprises latch means for holding stored data items of a non-volatile memory cell rank at an address designated in a read mode.

3. The non-volatile memory according to claim 1, further comprising rank selection means for selecting a specified rank within said group of non-volatile memory cells operable in a bulk erase mode to form a first signal containing the control data for selecting a predetermined rank to be preserved and subsequently forming a second signal for selecting other ranks.

4. A microcomputer comprising a built-in non-volatile memory comprising a group of non-volatile memory cells, and means for electrically writing and erasing data into and from said group of non-volatile memory cells, whereby as contents of at least one rank of memory cells are conserved, the other memory cell ranks can be erased according to control data retrieved from the group of non-volatile memory cells, the control data represents one rank of the protected memory bells conserved.

5. A non-volatile semiconductor memory comprising:
   a memory array comprising a plurality of non-volatile memory cells;
   selection means coupled to said memory array for selecting non-volatile memory cells from said memory array during an erasure mode;
   information storage means for storing information provided from said selected non-volatile memory cells, said information identifying non-volatile memory cells within said memory array not to be erased during the erasure mode;
   erasing means, coupled to said memory array and to said information storage means, for erasing data stored in said non-volatile memory cells while excluding from erasure the non-volatile memory cells identified by said indication information stored in said information storage means.

6. The non-volatile semiconductor memory according to claim 5 wherein said information storage means includes a plurality of latch circuits for storing said information.

7. The non-volatile semiconductor memory according to claim 6 wherein each of said non-volatile memory cells includes an electrically erasable and programmable memory element.

8. In a microcomputer having a random access memory, an interface circuit, a non-volatile memory having a plurality of non-volatile memory cells, and a central processing unit coupled to said random access memory, to said interface circuit and to said non-volatile memory, a method of erasing data stored in said non-volatile memory comprising steps of:
   (a) selecting predetermined non-volatile memory cells from the plurality of non-volatile memory cells of said non-volatile memory;
   (b) writing information from said predetermined non-volatile memory cells to a storage means, the information indicating non-volatile memory cells not to be erased; and,
   (c) erasing the data stored in said non-volatile memory cells while not erasing the non-volatile memory cells identified by said information stored in said storage means.

9. The method according to claim 8 wherein the erasing comprises electrically erasing the non-volatile memory cells.

10. An integrated circuit card comprising a microcomputer having a random access memory, an interface circuit, a non-volatile memory and a central processing unit coupled to said random access memory, to said interface circuit and to non-volatile memory, wherein said non-volatile memory comprises:
   a memory array having a plurality of non-volatile memory cells;

selection means, coupled to said memory array, for selecting non-volatile memory cells from said memory array during an erasure mode;

information storage means for storing information provided from said selected non-volatile memory cells, said information including indication information for identifying non-volatile memory cells within said array not to be erased;

erasing means, coupled to said memory array and to said information storage means, for erasing data stored in said non-volatile memory cells except the non-volatile memory cells identified by said indication information stored to said information storage means.

11. The integrated circuit card according to claim 10, wherein each of said memory cells includes an electrically erasable and programmable memory element.

12. A microcomputer, formed on a single chip, having a random access memory, an interface circuit, a non-volatile memory and a central processing unit coupled to said random access memory, to said interface circuit and to said non-volatile memory, wherein said non-volatile memory comprises:

a memory array having a plurality of non-volatile memory cells;

selection means, coupled to said memory array, for selecting non-volatile memory cells from said memory array during an erasure mode;

information storage means for storing information provided from said selected non-volatile memory cells, said information including indication information for identifying non-volatile memory cells within said memory array not to be erased;

erasing means, coupled to said memory array and to said information storage means, for erasing data stored in said non-volatile memory cells while excluding from erasure the non-volatile memory cells indicated by said indication information stored in said information storage means.

13. The microcomputer according to claim 12 further comprising an external terminal coupled to said non-volatile memory for accessing said non-volatile memory.

14. The microcomputer according to claim 13 further comprising an external control terminal for receiving a control signal and mode setting means, coupled to said external control terminal, for delivering a mode signal to indicate whether said non-volatile memory is accessed by said central processing unit or accessed externally via said external terminal on the basis of said control signal.

15. The microcomputer according to claim 13 wherein said external control terminal includes an external erase control terminal for receiving an erase control signal, and wherein said erasing means includes means responsive to said external erase control signal for erasing data stored in said non-volatile memory cells.

16. The microcomputer according to claim 15 wherein said erasing means includes means, responsive to a control signal from said central processing unit, for erasing data stored in said non-volatile memory cells.

17. The microcomputer according to claim 12 wherein said interface circuit includes communication means for sending data to and receiving data from external equipment, and wherein said microcomputer includes a read only memory for storing a program.

18. The microcomputer according to claim 17 wherein each of said non-volatile memory cells includes an electronically erasable and programmable memory element.

* * * * *